United States Patent [19]

Scheps

[11] Patent Number: 5,682,397
[45] Date of Patent: Oct. 28, 1997

[54] ER:YALO UPCONVERSION LASER

[75] Inventor: Richard Scheps, Del Mar, Calif.

[73] Assignee: The United States of America as represented by the Secretary of the Navy, Washington, D.C.

[21] Appl. No.: 565,075

[22] Filed: Nov. 30, 1995

Related U.S. Application Data

[63] Continuation of Ser. No. 299,865, Sep. 1, 1994, Pat. No. 5,530,711.

[51] Int. Cl.[6] .................................................. H05S 3/10
[52] U.S. Cl. .................... 372/22; 372/41; 372/6; 372/12; 372/39; 372/69; 372/34; 372/71; 372/56; 372/13; 372/14; 372/20
[58] Field of Search ........................ 372/72, 68, 69–71, 372/97, 22, 34, 39, 258, 41, 6, 12, 75, 14, 56

[56] References Cited

U.S. PATENT DOCUMENTS

| | | | |
|---|---|---|---|
| 3,805,186 | 4/1974 | Woodcock | 372/34 |
| 3,914,618 | 10/1975 | Harris | 307/88.3 |
| 3,949,319 | 4/1976 | Tofield | 331/94.5 |
| 4,872,177 | 10/1989 | Baer et al. | 372/75 |
| 4,949,348 | 8/1990 | Nguyen et al. | 372/41 |
| 4,980,566 | 12/1990 | Heilweil | 250/339 |
| 4,995,046 | 2/1991 | Fan et al. | 372/41 |
| 5,008,890 | 4/1991 | McFarlane | 372/41 |
| 5,014,279 | 5/1991 | Esterowitz et al. | 372/41 |
| 5,022,040 | 6/1991 | Pollack et al. | 372/69 |
| 5,036,520 | 7/1991 | Bowman et al. | 372/41 |
| 5,038,358 | 8/1991 | Rand | 372/69 |
| 5,086,432 | 2/1992 | Esterowitz et al. | 372/71 |
| 5,117,437 | 5/1992 | Rand | 372/91 |
| 5,130,997 | 7/1992 | Ortiz et al. | 372/22 |
| 5,177,751 | 1/1993 | Kobayashi et al. | 372/22 |
| 5,182,759 | 1/1993 | Anthon et al. | 372/68 |
| 5,200,966 | 4/1993 | Esterowitz et al. | 372/71 |
| 5,274,658 | 12/1993 | Case et al. | 372/41 |
| 5,287,373 | 2/1994 | Rapoport et al. | 372/41 |
| 5,289,482 | 2/1994 | Esterowitz | 372/41 |
| 5,321,718 | 6/1994 | Waarts et al. | 372/108 |
| 5,369,523 | 11/1994 | Millar et al. | 359/341 |
| 5,426,656 | 6/1995 | Tohmon et al. | 372/39 |
| 5,436,919 | 7/1995 | Chwalek et al. | 372/7 |
| 5,459,745 | 10/1995 | Esterowitz et al. | 372/41 |
| 5,530,709 | 6/1996 | Waarts et al. | 372/6 |
| 5,530,711 | 6/1996 | Scheps | 372/54 |

*Primary Examiner*—Leon Scott, Jr.
*Attorney, Agent, or Firm*—Harvey Fendelman; Thomas Glenn Keough; Eric James Whitesell

[57] ABSTRACT

A laser comprises an upconversion laser gain element made of a crystalline oxide host doped with activator ions for emitting output radiation at an output wavelength. The gain element is pumped by pumping radiation at a pumping wavelength that is longer than the output wavelength. A laser resonator comprising a reflective element and an output coupler is arranged with the gain element to resonate the output radiation. The reflective element is spaced from the output coupler by a distance approaching the radius of curvature of the reflective element or the output coupler. The pumping radiation has a waist that is substantially coincident with the waist of the output radiation within the active region of the gain element.

55 Claims, 25 Drawing Sheets

ER:YALO UPCONVERSION LASER

CROSS-REFERENCE TO RELATED APPLICATIONS

This application is a continuation of application Ser. No. 08/299,865 filed Sep. 1, 1994 and issued on Jun. 25, 1996 as U.S. Pat. No. 5,530,711.

BACKGROUND OF THE INVENTION

The present invention relates to lasers and laser pumping techniques and particularly to an upconversion laser that is optically pumped at wavelengths longer than the laser emission wavelength.

Upconversion lasers are among the most efficient sources of coherent visible and near-ultraviolet radiation. Laser emission has been demonstrated in both the continuous (cw) and pulsed modes. These types of lasers can provide practical solutions for applications as diverse as medical diagnosis and treatment, underwater surveillance and full-color, solid state displays. Upconversion generally refers to energy transfer processes that are initiated by photon absorption. Upconversion produces a population of ions in an excited state that exceeds the pumping photon energy, causing ions returning from the excited state to emit photons having a shorter wavelength than that of the pumping photons. One example of how an upconversion laser may be used is to convert infrared laser energy to visible laser energy.

In upconversion, two or more photons may be absorbed sequentially to raise the energy level of an ion to an excited state. In theory, the mechanism of sequential absorption operates in a medium that absorbs a photon and raises an ion to an intermediate energy level that acts as an energy reservoir. The intermediate energy level has a fluorescence lifetime typically on the order of milliseconds, during which time an additional photon may be absorbed to further raise the energy state of the ion to a stable value While upconversion may take place on a single ion center, upconversion energy transfer involving two distinct ions may also occur. For example, if each of two neighboring ions absorbs a pump photon of the same energy, both ions may populate a metastable level. This process has the advantage of requiring only one pump wavelength and forms the basis for the pumping mechanism or technique described by McFarlane in U.S. Pat. No. 5,008,890, as well as that by Rand in U.S. Pat. No. 5,117,437. This technique, called cooperative energy transfer, is similar to Auger recombination in which one ion transfers its absorbed energy to another ion. Since both ions are initially in an excited metastable level, the energy donor ion returns back to the ground state while the energy acceptor ion is promoted to a higher level, typically an upper level from which laser emission occurs.

Simultaneous absorption of photons by both the donor and acceptor ions is not required for cooperative energy transfer since the long lifetime of the metastable level allows the excitation of two neighboring ions to occur sequentially within a given time frame. The cooperative energy transfer pump technique is similar to another upconversion pump process or technique called sequential two-photon absorption. In this case, a single ion is involved. Pump photons at a first wavelength are absorbed by ions in the ground state to promote these ions to the metastable level. Pump photons at a second wavelength are then absorbed by ions in the metastable level to produce the upper level from which laser emission occurs. Another way to convert the fundamental infrared emission to the visible relies on non-linear optical techniques such as harmonic generation or optical parametric oscillation. Most solid state lasers produce fundamental radiation in the infrared. For example, Nd:YAG which is a trivalent neodymium ion-doped solid state laser which operates at either 1.06 µm or 1.3 µm. The crystalline host YAG ($Y_3Al_5O_{12}$) is a garnet. Another common solid state laser is Ti:sapphire, a commercially available trivalent transition ion-doped tunable laser with a peak emission wavelength at approximately 780 nm.

Because of the strong dependence of laser efficiency on radiated power, non-linear conversion of cw radiation is preferably performed within a laser resonator cavity or in an external cavity. However, intracavity techniques may result in unwanted amplitude instability unless the laser is operated in single longitudinal mode. External cavity techniques typically comprise intricate feedback mechanisms to ensure that the external cavity is in continuous resonance with an input radiation having a single frequency.

In contrast, upconversion laser emission is an effective means of converting infrared radiation to the visible without many of the constraints associated with non-linear optical techniques.

Photon avalanche upconversion is perhaps the most complicated upconversion pump technique. Photon avalanche involves energy transfer between an excited ion and an ion in the ground state. This process is similar to quenching and results in both ions populating a level intermediate in energy to the excited state originally occupied by the donor ion.

The narrow absorption linewidths of rare earth doped crystals used in upconversion lasers typically comprise tunable, monochromatic optical pump sources. However, for certain upconversion pump processes the absorption coefficient of the crystal at the pump wavelength may be small. For example, if the pump radiation may only be absorbed by ions in the metastable state, then the population of absorbers is low. Since the population of absorbers is low, the fraction of absorbed incident pump flux will also be low.

In some cases, upconversion pumping may require non-resonant absorption. Non-resonant absorption refers to a pump wavelength that is not within the absorption bandwidth of a given absorption line. Upconversion means that the pump wavelength is outside the absorption bandwidth, which may be the case, for example, when using a non-tunable laser pump source or when the bandwidth of the pump source is wider than the absorption bandwidth. In such cases the pump flux may be poorly absorbed, resulting in both a low upconversion efficiency and a low optical conversion efficiency. Optical conversion efficiency is the fraction of incident pump photons that produce laser photons. Optical pumping of an upconversion laser gain element where only a small fraction of the incident pump flux is absorbed typically results in low efficiency upconversion pumping.

A continuing need therefore exists for an upconversion laser that produces high optical conversion efficiency.

SUMMARY OF THE INVENTION

A laser comprises an upconversion laser gain element made of a crystalline oxide host doped with activator ions for emitting output radiation at an output wavelength. The gain element is pumped by pumping radiation at a pumping wavelength that is longer than the output wavelength. A laser resonator comprising a reflective element and an output coupler is arranged with the gain element to resonate the output radiation. The reflective element is spaced from the output coupler by a distance approaching the radius of curvature of the reflective element or the output coupler. The pumping radiation has a waist that is substantially coincident with the waist of the output radiation within the active region of the gain element.

DESCRIPTION OF THE INVENTION

Figure 1:
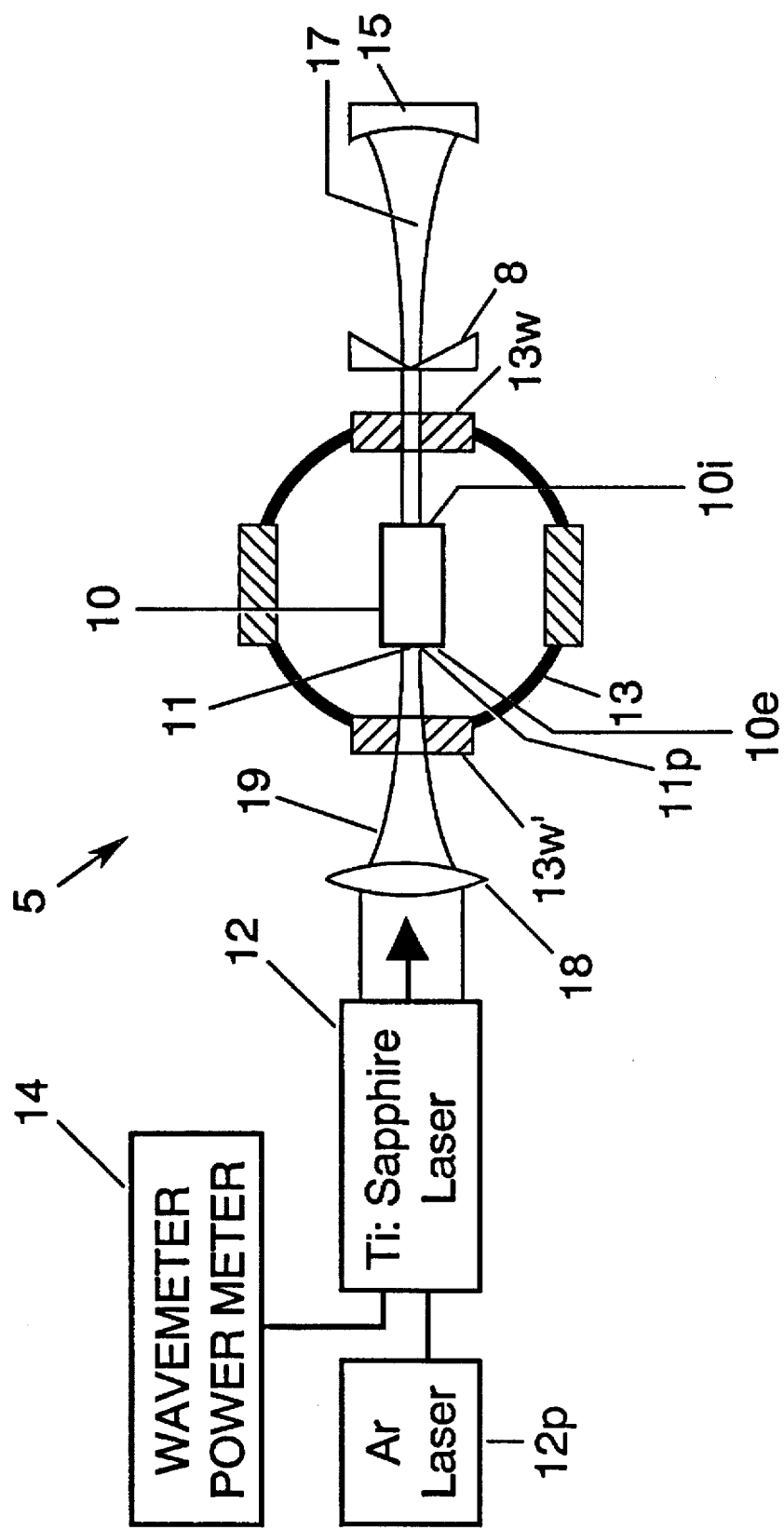
FIG. 1 illustrates a first embodiment of the upconversion laser of the present invention.

Laser resonators are devices containing reflective mirrors, a gain element and other optical components aligned to produce laser emission. In the simplest form, a laser resonator is composed of two reflective mirrors placed on either side of a gain element. The mirrors are aligned to form a reflective path that passes through the gain element. The laser resonator cavity refers to the region of space between the two reflective mirrors. Optical radiation resonates between the two reflective mirrors. For stable resonators the spatial distribution of radiation contained within the laser resonator cavity can be described in terms of a laser resonator mode. The laser resonator mode describes the spatial distribution or energy at any position within the laser resonator cavity. The lowest order laser resonator mode is called the $TEM_{00}$ mode. The $TEM_{00}$ mode is generally preferred because it provides the smallest laser resonator mode waist or focus of any of the spatial resonator modes. The smaller the laser resonator mode waist, the higher the intracavity radiation intensity. This provides higher extraction efficiency. In addition, the $TEM_{00}$ mode provides the lowest divergence for the laser resonator mode and therefore provides collimation over a long spatial range for the laser beam emitted by the laser resonator.

Upconversion lasers are distinguished from conventional lasers by the unique optical pump mechanism used to produce the upper laser level. In conventional lasers that are optically pumped, the wavelength emitted by the laser is at a longer wavelength than the pump wavelength. This is required by conservation of energy. On the other hand, with upconversion lasers the emitted wavelength is shorter than the wavelength of the pump flux; that is, the photons emitted by the laser are at a higher energy than the pump photons. This comes about because two or more pump photons are used to produce an ion in the upper laser level.

Generally, three type of upconversion pump processes have been observed to produce upconversion lasers. The first is sequential two-photon absorption. In this case, a single ion absorbs a first photon which promotes the ion to an excited state. A second photon, not necessarily at the same wavelength as the first photon, is then used to promote the ion from the excited state to the upper laser level.

A second process for producing the upper laser level by upconversion is called cooperative energy transfer upconversion. In this process, two photons, generally at the same wavelength, promote neighboring ions in the upconversion gain medium to an excited state. Energy transfer between the neighboring ions can take place by, for example, dipole-dipole interaction. The result of the cooperative upconversion process is that one of the ions, termed the donor ion, transfers its energy to the other ion, termed the acceptor ion. The donor ion, as required by conservation of energy, decays to a lower energy level while the acceptor ion is promoted to a higher energy level, typically the upper laser level.

A third pump mechanism, sometimes called photon avalanche upconversion, is initiated by the absorption of a photon by an ion in a metastable state. A metastable state is an excited state which is characterized by a relatively long fluorescence decay lifetime. Photon absorption promotes the ion from the metastable state to a higher excited state, typically the upper laser level. Ions in the upper laser level can produce optical emission or, alternatively, can be quenched by neighboring ions in the ground state. Quenching is an energy transfer process which promotes the ground state ion to the metastable state while de-exciting the ion in the upper laser level to the metastable state as well.

Therefore, starting with one ion in a metastable state which absorbs a photon, the cycle of energy transfer produces two ions in the metastable state. These two ions can produce four by the same cycle, the four can produce eight, and so on, giving rise to the term "photon avalanche". The photon avalanche process produces an avalanche of population in the metastable state which is far greater than the normal steady state population in the metastable state. The high population in the metastable state provides a reservoir of absorbers to produce the upper laser level, some of which by branching will emit down to the ground state and produce upconversion laser emission.

Crystalline upconversion laser gain elements typically contain a trivalent rare earth ion doped in a suitable oxide or fluoride host crystal. An upconversion laser gain element, or upconversion laser crystal, is one that can produce upconversion laser emission. It differs from traditional gain elements in that the activator ion doping concentration is relatively high. In addition, many crystal hosts and activator ions that produce efficient traditional laser emission are not capable of producing upconversion laser emission.

Most demonstrations of upconversion laser emission have taken place in fluoride hosts. The fluoride host is preferred because the low photon frequencies produce long lifetimes for the metastable states involved.

Few demonstrations of upconversion laser emission in oxide-containing crystal hosts are known. The trivalent rare earth ions (or activator ions) that have demonstrated upconversion laser emission are $Pr^{3+}$, $Nd^{3+}$, $Ho^{3+}$, $Er^{3+}$, and $Tm^{3+}$. A requirement for efficient upconversion emission is the presence of intermediate metastable states, and these five trivalent rare earth ions in crystalline hosts have numerous metastable levels.

One of the few demonstrations of upconversion laser emission in a non-halide-containing crystal was Tm:YAG. See for example B. P. Scott, F. Zhao, R. S. F. Chang and N. Djeu, *Optics Letters*, vol. 18, p. 113, 1993. The emission wavelength in this case was 486 nm. YAG is an oxide containing garnet structure with a chemical formula $Y_3Al_5O_{12}$. Laser emission was not very efficient. In addition, Er:YAG produced upconversion laser emission at 561 nm. The output energy in this crystal was extremely low as well. See for example, R. Brede, E. Heumann, J. Koetke, G. Huber and B. Chai, *Applied Physics Letters*, vol. 63, p. 2030, 1993. A third demonstration of upconversion laser emission in an oxygen-containing host was produced by sequential two-photon absorption, see for example, A. J. Silversmith, W. Lenth and R. M. MacFarlane, *Applied Physics Letters*, vol. 51, p. 1977, 1987. The upconversion gain element in this third report was Er:YALO and low optical conversion efficiencies were reported. Er:YALO denotes an yttrium orthoaluminate crystal doped with trivalent erbium ions.

There are numerous difficulties that must be overcome to demonstrate upconversion in an oxide-containing crystalline host such as YALO or YAG. Because the metastable state lifetimes are considerably shorter in oxygen-containing materials, it is vital that an appropriate laser resonator design be configured. A proper configuration includes both the pump optics and the laser resonator. For example, Er:YALO can demonstrate extremely high optical conversion efficiencies when an appropriate resonator and pump configuration is constructed. In such a configuration, it can be shown that Er:YALO produces efficient upconversion emission at 550 nm through either sequential two-photon absorption upconversion, cooperative energy transfer upconversion, or photon avalanche upconversion. The specific pump mechanism is chosen by selecting the pump wavelength in the 800 nm range. By appropriate configuration of the resonator and pump optics, and by proper selection of the pump wavelength, efficient upconversion laser emission in this oxide-containing host can be produced.

YALO is an acronym for a crystal with the chemical formula $YAlO_3$. The proper name for this crystal is yttrium orthoaluminate. The crystal is commonly referred to as YALO, or alternatively, YAP. The "P" stands for perovskite which is the class of crystal structure.

An example of efficient upconversion laser emission according to the present invention may be demonstrated with a 10 mm long, 6.4 mm diameter, Er:YALO laser rod containing 1.5 atom-% $Er^{3+}$ ions, although other activator ions doped in YALO or other host materials may also be used. The end faces of the cylindrical rod are preferably polished to better than 1/10 wave flatness and to 2 arc seconds parallelism. One of the end faces preferably has a dichroic coating that is highly reflective (HR) at 550 nm and highly transmissive (HT) from 780 nm to 850 nm, while the other face is preferably antireflective (AR) coated for 550 nm.

In FIG. 1, optical excitation of an upconversion laser gain element 10 is performed by pump laser 12. Gain element 10 may be, for example, an Er:YALO crystal, and pump laser 12 a Ti:sapphire laser. The external face 10e of upconversion laser gain element 10 is coated to be HR at 550 nm and HT from 780 to 850 nm, and the interior face 10i is coated AR at 550 nm. Pump laser 12 may be pumped by an argon ion laser 12p. Argon ion laser 12p typically produces about six watts of power, and a Ti:sapphire laser for pump laser 12 about 1.08 watts of output pump power at approximately 807 nm. Pump laser 12 preferably produces a tunable pump radiation over a range of wavelengths from approximately 700 nm to 1000 nm.

Alternatively pump laser 12 may be a dual wavelength Ti:sapphire laser. The dual wavelength Ti:sapphire laser is also excited by an argon ion laser and produces output radiation at two wavelengths. This type of laser is particularly useful for sequential two-photon absorption upconversion devices. This laser is described in more detail in U.S. Pat. No. 5,276,695 included herein by reference thereto. This dual wavelength laser typically produces over 400 mW of total power when operated at wavelength pairs suitable for sequential two-photon absorption upconversion pumping of Er:YALO. An example of such a wavelength pair is approximately 785 nm and approximately 840 nm.

Still referring to FIG. 1, upconversion laser gain element 10 may be arranged in a closed cycle helium cryostat 13. Cryostat 13 typically produces a temperature as low as 6.7° K. and maintains temperature control to ±0.1° K. The output wavelength of pump laser 12 may be measured with a commercially available wavemeter 14. Wavemeter 14 also contains a power meter and is positioned to monitor optical pump power radiating from the rear reflector of pump laser 12.

To operate upconversion lasers at high efficiency it is desirable to produce a high pump power within the gain element active region. This is particularly important for crystalline oxide hosts where the metastable state lifetimes are shorter than in fluoride and other halide crystal hosts. The active region is the volume of the laser gain element at the waist of the laser output beam.

The sharp absorption feature characteristic of rare earth doped solids render polychromatic sources such as filament lamps and flash lamps ineffective for upconversion laser pumping. On the other hand, monochromatic end pumping produces a high density of excited ions in a small volume. In addition, the laser resonator can be designed so that the pump beam waist is coincident with the waist of the laser output beam. Coinciding the pump beam waist with the laser output beam waist is called mode matching.

An advantage of mode matching is that diffractive losses associated with using a hard aperture may be avoided. With ideal mode matching, none of the laser pump energy will be deposited outside of the active region. Energy deposited outside of the active region is not normally extracted and represents a loss in pump efficiency.

Tunable monochromatic pump sources are well suited for pumping in the narrow absorption linewidths of rare earth doped crystals. For continuous wave (cw) operation, a Ti:sapphire tunable laser pumped by an argon ion laser is an exemplary pumping source. An example of a suitable pumping source for pulsed operation is the Ti:sapphire laser pumped by a doubled Nd:YAG laser. In the range of pump wavelengths used for upconversion, typically 700–900 nm, laser diodes are an exemplary pumping source. The cost, size and inefficiency of an argon ion laser capable of producing 1 watt of Ti:sapphire laser pump power at 800 nm is a disadvantage in the design of upconversion lasers. On the other hand, laser diodes are relatively inexpensive, small and efficient. The electrical-to-optical conversion efficiency for a 1 Watt, 800 nm laser diode exceeds 30%. The diode operating lifetime is several hundred thousand hours compared to just a few thousand hours for an ion laser tube. Also, the laser diode output wavelength may be tuned to match the absorption resonance of the upconversion gain element. By adjusting the diode temperature and drive current, the output wavelength can be readily tuned over a range of several nm. For larger wavelength tuning ranges, the diode may be operated in an external cavity resonator. Tuning ranges of 25 nm or more are routinely achieved in commercially available external cavity laser diodes.

Single longitudinal mode, index-guided laser diodes are presently available with output powers up to 200 mW. Such devices may be as efficient as a Ti:sapphire laser in producing upconversion emission. Alternatively, line narrowing and beam profile control techniques can be used to produce efficient high power laser diode pump beams for upconversion lasers.

Figure 2:
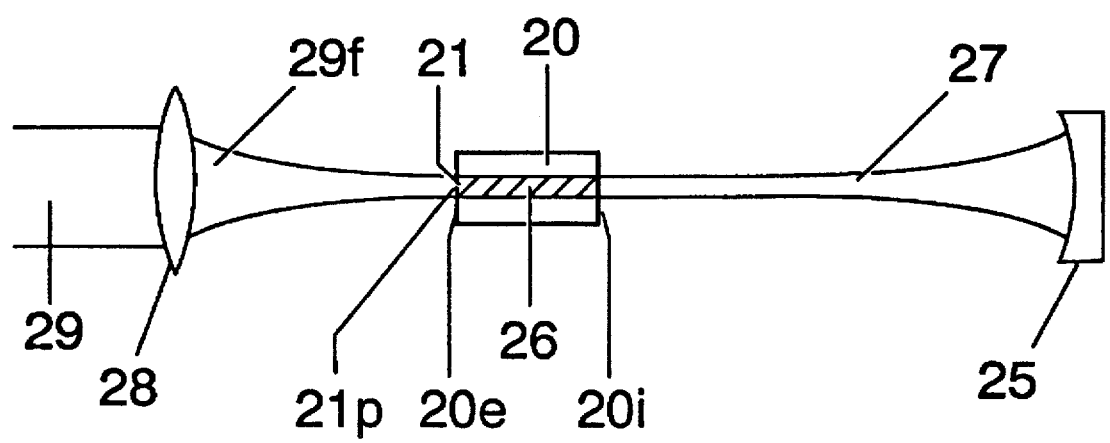
FIG. 2 illustrates mode matching.

There are many types of laser resonator configurations, but one of the most efficient for upconversion laser pumping is the hemispherical laser resonator. A hemispherical laser resonator and pump optics are illustrated in FIG. 2. In this example, the resonator consists of two components, upconversion laser gain element 20 and output mirror 25. The exterior face 20e of laser gain element 20 is coated with a dichroic coating that is HR at the output or emitted wavelength of the upconversion laser and HT at the pump wavelength of a collimated pump beam 29. This coating serves as the HR rear reflector of the laser resonator. The interior face 20i of laser crystal 20 is coated AR at the output wavelength of the upconversion laser. Output coupler mirror 25 is coated for partial reflectivity at the output wavelength of the upconversion laser. Output coupler mirror 25 is concave and typically has a relatively short radius of curvature. The separation between output coupler mirror 25 and exterior face 20e of laser gain element 20 approaches the radius of curvature of output coupler mirror 25, which is why the term "hemispherical" is used to describe hemispherical laser resonator mode 27. The laser resonator mode waist or focus 21 is located at exterior face 20e of laser gain element 20. The laser resonator extends from exterior face 20e of laser crystal 20 to the concave curved face of output coupler mirror 25, defining a laser resonator cavity between exterior face 20e and output coupler mirror 25.

Hemispherical laser resonator mode 27 contains a waist or focus 21 at exterior face 20e of laser gain element 20. The waist diameter is typically less than 50 μm. The active region 26 of upconversion laser gain element 20 illustrated in FIG. 2 is shown by the hatched lines in laser gain element 20. Optimum pump efficiency may be obtained by aligning the pump optics so that pump energy is deposited only within active region 26. This may be accomplished for monochromatic end pumping using a pumping laser (not shown) in conjunction with short focal length lens 28. Collimated pump beam 29 is produced by a suitable pump laser at an appropriate wavelength and is focused by focusing lens 28 to form a pump waist 21p that coincides with laser beam waist 21 at exterior face 20e of laser gain element 20. Mode matching is performed by proper selection of the focal length of focusing lens 28 and the spacing between focusing lens 28 and exterior face 20e of laser crystal 20.

In ideal mode matching the waist of focused pump beam 29f in laser crystal 20 coincides with active volume 26 in laser crystal 20. Deviations from the ideal mode matching illustrated in FIG. 2 generally reduce the overall pump efficiency. Pump efficiency may also be improved by keeping active region 26 as small as possible, consistent with pump intensity and thermal loading considerations.

End pumping is used in FIG. 2 to provide an effective path length for absorption of pumping radiation. This is particularly important when the absorption coefficient of laser gain element 20 is relatively low at the pump wavelength of pump beam 29. An example of low absorption is the absorption of energy from ions in a metastable excited state.

Referring back to FIG. 1, output mirror 15 is aligned with respect to exterior face 10e of upconversion laser gain element 10 to produce hemispherical laser resonator mode 17. A small laser beam waist 11 is established at exterior face 10e of upconversion laser gain element 10 by output mirror 15. Output mirror 15 may has a radius of curvature, for example, of 10 cm. The separation between output mirror 15 and exterior face 10e consequently approaches 10 cm.

The resonator design illustrated in FIG. 1 may include the use of an intracavity cryostat window 13w. Intracavity cryostat window 13w is AR coated on both faces at 550 nm and the combined reflectivity from both surfaces at 550 nm is less than 0.4%. The collimated output from pump laser 12 is focused onto the exterior face 10e of upconversion laser gain element 10 with a 50 mm focal length focusing lens 18. The pump flux enters cryostat 13 through cryostat window 13w' which is AR coated on both faces at the pump wavelength and is 96.4% transmissive for pump wavelengths emitted by pump laser 12. The diameter of the pump flux focus spot 11p at exterior face 10e of upconversion laser gain element 10 may be 21 μm, for example.

Upconversion laser 5 may produce repetitively Q-switched operation when pumped continuously by intracavity chopper 8. The laser resonator cavity in upconversion laser 5 extends from exterior face 10e of upconversion laser gain element 10 to the concave face of output mirror 15. Q-switching may be performed by an aperture pattern on a rotating disc driven by a variable speed precision motor. Q-switched rates up to, for example, 3 kHz may be used with an exemplary chopper aperture of 1.5 mm. The laser beam diameter at the chopper blade is typically less than 1 mm.

Figure 3:
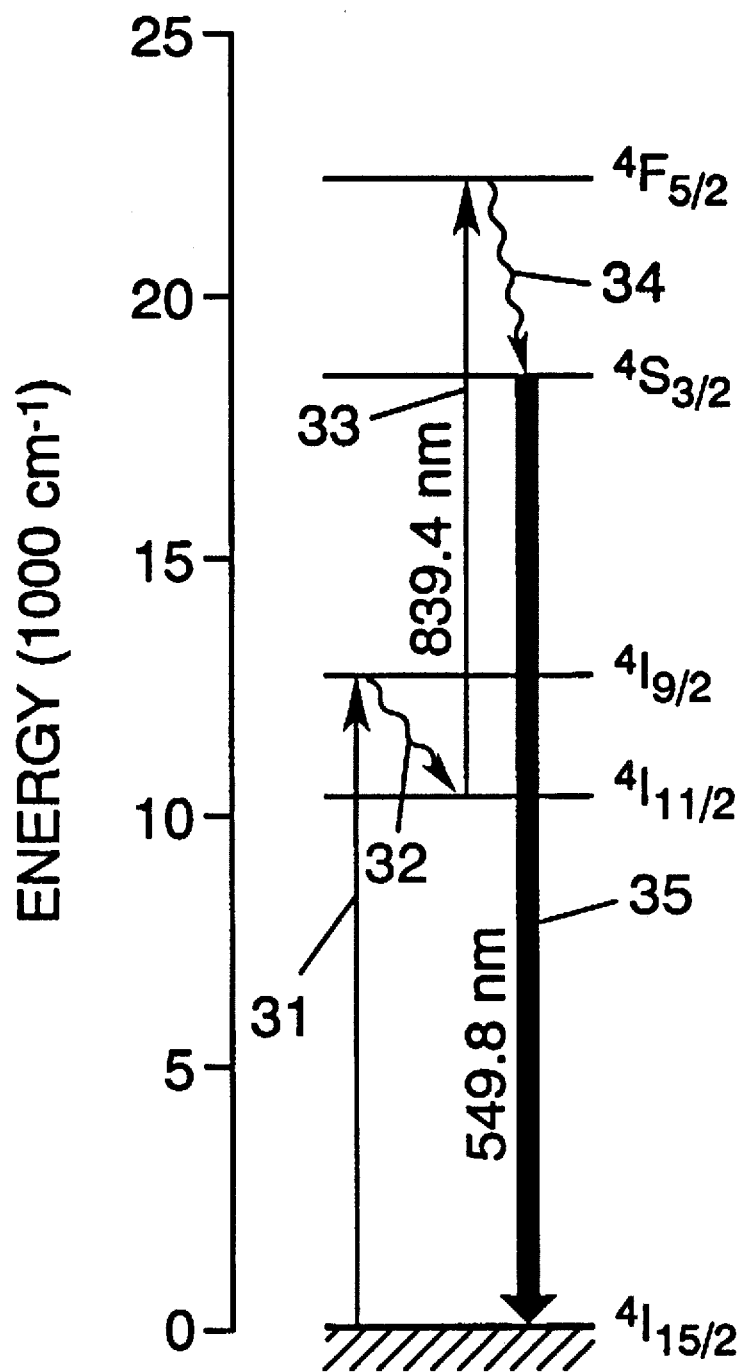
FIG. 3 illustrates energy levels in sequential two photon upconversion in Er:YALO.

Theoretical energy flow dynamics for sequential two-photon absorption upconversion in Er:YALO are illustrated in FIG. 3. Absorption of a first photon illustrated by arrow 31 in FIG. 3 promotes an ion from the $^4I_{15/2}$ ground state to the $^4I_{9/2}$ excited state. Non-radiative relaxation from the $^4I_{9/2}$ state produces the metastable $^4I_{11/2}$ state. The $^4I_{11/2}$ state has a lifetime of 1.2 ms in Er:YALO. Absorption of a second photon illustrated by arrow 33 in FIG. 3 promotes the metastable $^4I_{11/2}$ state to the $^4F_{5/2}$ state. Rapid relaxation, illustrated by wavy arrow 34, populates the $^4S_{3/2}$ upper laser level. The upper laser level has a lifetime of 160 µs in Er:YALO. The Er:YALO crystal was maintained at 7° K. At this temperature only the lowest Stark level of the ground state is occupied. Under these circumstances appropriate wavelengths for the transition indicated by arrow 31 in FIG. 3 ranged from 785.4 nm to 806.9 nm, while suitable pump wavelengths for the transition indicated by arrow 33 in FIG. 3 are in the range of 834.9 nm to 839.4 nm. In the context of the present invention, the term transition indicates that an activator ion undergoes a change from one ionic energy level to another ionic energy level. A transition can be induced by the absorption of a photon.

Efficient upconversion laser emission pumped by sequential two-photon absorption upconversion can be produced in Er:YALO by using the pump and resonator optics illustrated in FIG. 1. In this case, pump laser 12 is a dual wavelength Ti:sapphire laser. Using a total of 445 mW of incident pump power at 785 nm and 840 nm simultaneously, 8 mW of exemplary upconversion laser output power may be achieved. The reflectivity of output mirror 15 may be, for example, 0.90 R. The spectral composition of pump beam 19 may be, for example, 195 mW at 785 nm and 250 mW at 840 nm.

The upconversion laser output produced by the configuration illustrated in FIG. 1 is more than an order of magnitude higher than that reported previously. See A. J. Silversmith, W. Lenth and R. M. MacFarlane, *Applied Physics Letters*, vol. 51, p. 1977, 1987. Less than 0.8 mW was reported by Silversmith et al. when the Er:YALO crystal was pumped with 195 mW at 792 nm and 250 mW at 840 nm.

In addition, Silversmith et al. reported evidence of saturation, which means that the laser output power produced by the upconversion emission was no longer responsive to increases in pump power. On the other hand, the laser resonator in the configuration of FIG. 1 showed no evidence of saturation in Er:YALO.

Laser emission in Er:YALO is believed to occur along transition 35, as illustrated in FIG. 3, from the $^4S_{3/2}$ state to the $^4I_{15/2}$ state. Cooperative energy transfer upconversion appears to be the most efficient upconversion pump mechanism in Er:YALO. The optical conversion efficiency for 550 nm emission is all the more remarkable for a crystalline oxide host, since oxygen-containing crystal hosts have been previously reported to produce low conversion efficiencies.

Figure 4:
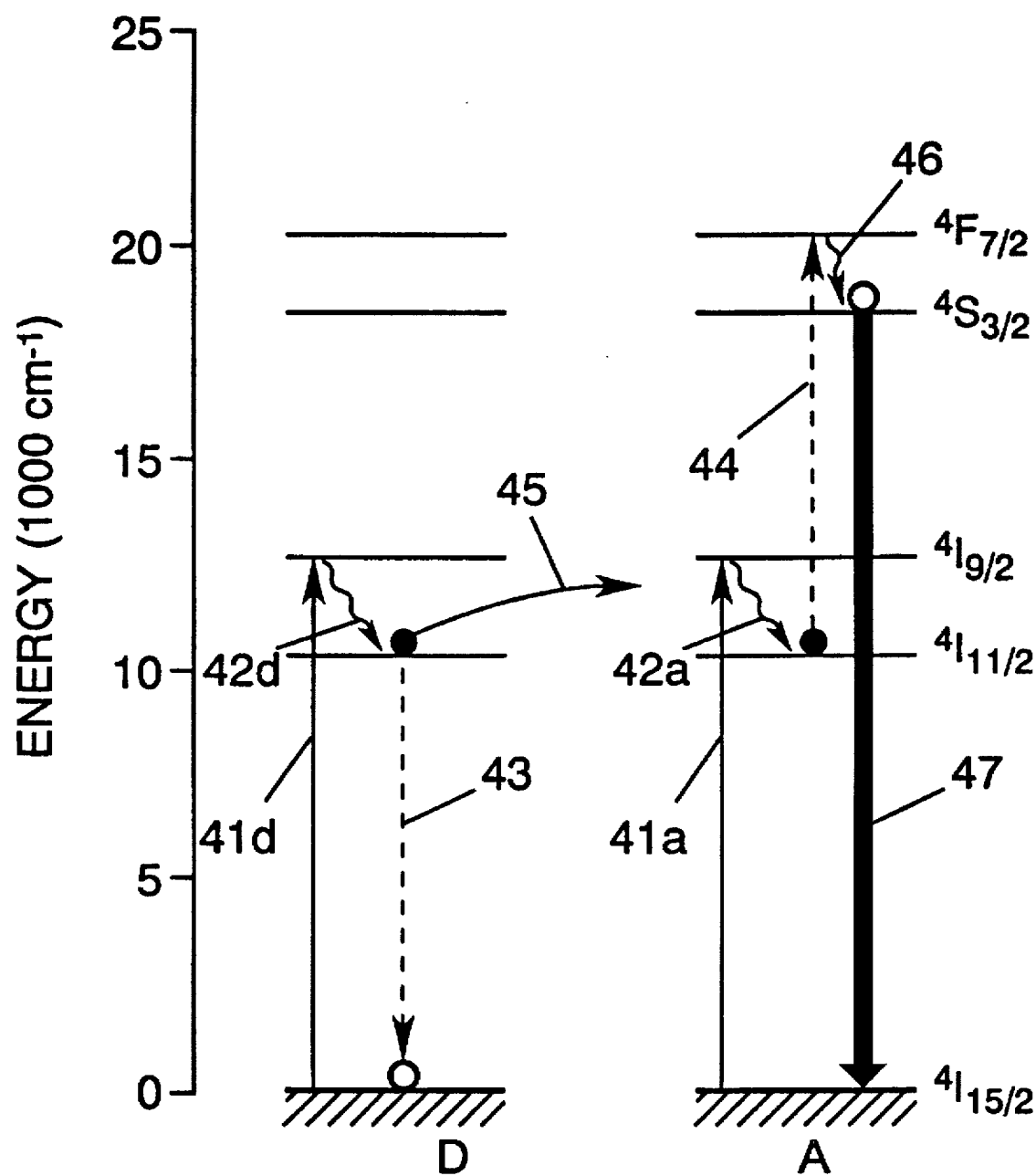
FIG. 4 illustrates energy levels in cooperative energy transfer upconversion in Er:YALO.

Theoretical energy flow dynamics for cooperative energy transfer upconversion in Er:YALO is illustrated in FIG. 4. The upconversion pump process is initiated by the promotion of an ion from the ground state, which is the $^4I_{15/2}$ state, to the $^4I_{9/2}$ state. The energy levels of two identical ions are illustrated in FIG. 4. These ions are neighboring ions in the YALO crystal lattice and one is labeled D for donor and the other is labeled A for acceptor. Two photons are required for the absorption processes illustrated in FIG. 4. One photon promotes ion D to the $^4I_{9/2}$ state, as indicated by arrow 41d, while the second photon is used to promote ion A as shown by the arrow labeled 41a. The photon absorbed by ion D is typically at the same wavelength as the photon absorbed by ion A. In this case, only a single wavelength is required to be produced by the pump laser. However, different wavelengths can be used as the absorption band for the transition from the ground state to the $^4I_{9/2}$ state spans the range of 785 nm to 807 nm when the crystal is maintained at 7° K.

The metastable $^4I_{11/2}$ state is populated by absorption followed by rapid non-radiative decay. The non-radiative decay process for the donor ion is labeled 42d while the non-radiative decay process for the acceptor ion is labeled 42a. Cooperative energy transfer involves two neighboring ions in the metastable state. In this energy transfer interaction, donor ion D relaxes to the ground state, as indicated by dashed line 43, while acceptor ion A is promoted to the $^4F_{7/2}$ state, as indicated by the dashed line labeled 44. Arrow 45 indicates the direction of the transfer of energy. Rapid relaxation from the $^4F_{7/2}$ state indicated by wavy arrow 46 populates the $^4S_{3/2}$ upper laser level. The laser transition is indicated by heavy arrow 47. As can be seen from FIG. 4, an important advantage of cooperative energy transfer upconversion pumping compared to sequential two-photon absorption is that only one pump wavelength need be used.

Figure 5:
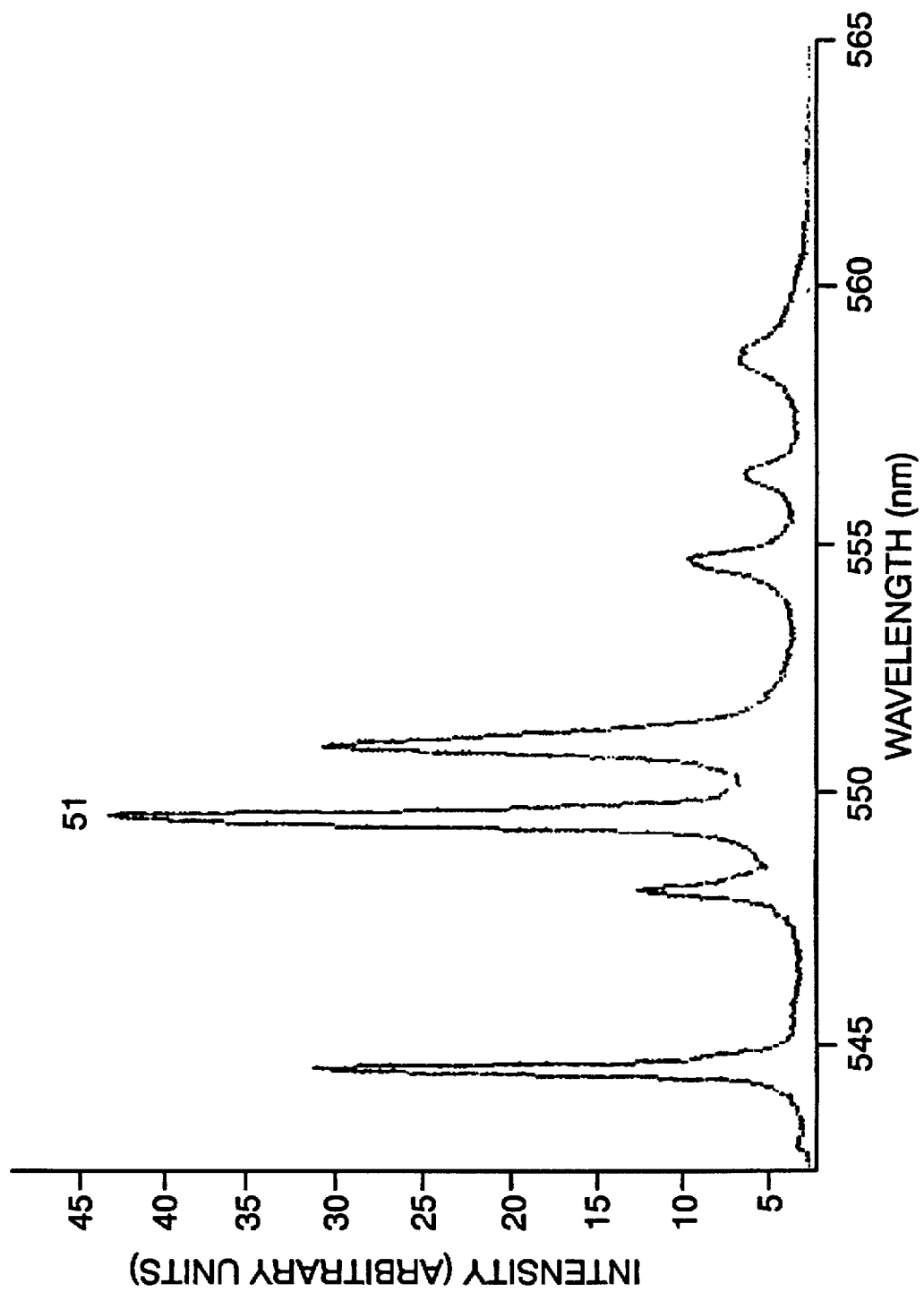
FIG. 5 shows the green fluorescence spectrum emitted by Er:YALO.
Figure 6:
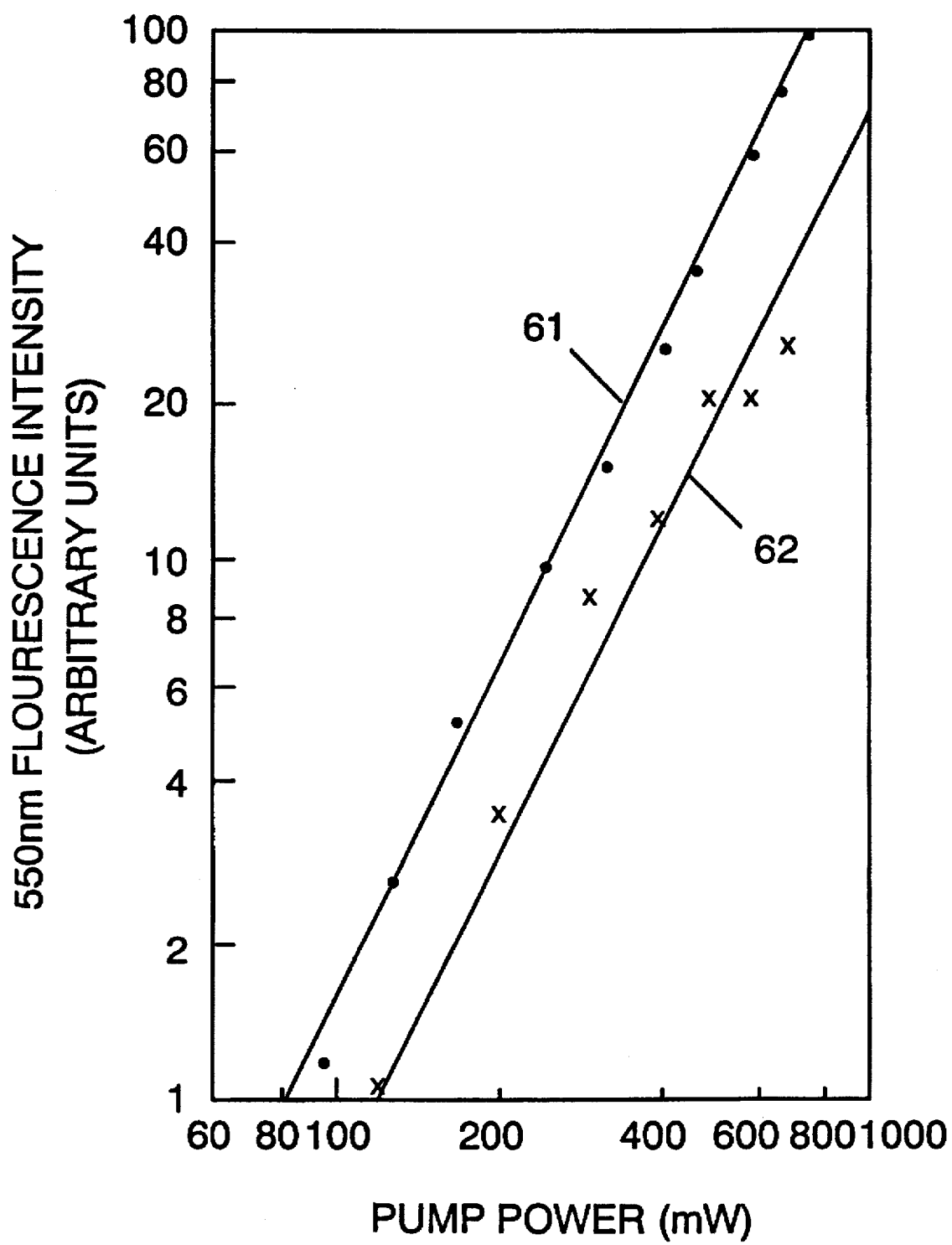
FIG. 6 shows the dependence of the upconversion fluorescence intensity on pump wavelength for Er:YALO.

The fluorescence emission spectrum at 7° K. for Er:YALO is illustrated in FIG. 5. This spectrum is produced by upconversion pumping at 8.06.9 nm. The sharp peak 51 at 550 nm is the strongest line in the green emission band and represents transitions from the lowest Stark component of the $^4S_{3/2}$ state to the fourth Stark level of the $^4I_{15/2}$ state. The dependence of the fluorescence pumped by cooperative energy transfer upconversion on the pump power is illustrated in FIG. 6. The green 550 nm upconversion fluorescence intensity is shown as a function of 806.9 nm pump power. Both axes are logarithmic. Straight line 61 is a linear regression fit to the solid dot data points which were taken at 298° K. Straight line 62 is a linear regression fit to the data points indicated with X's which were taken at 7° K. Both lines show a slope of 2. A slope of 2 on a full logarithmic plot indicates a quadratic dependence of the fluorescence intensity on the pump power. This is to be expected for cooperative energy transfer upconversion since two photons are required to produce one ion in the $^4S_{3/2}$ emitting level, as illustrated in FIG. 4.

Figure 7:
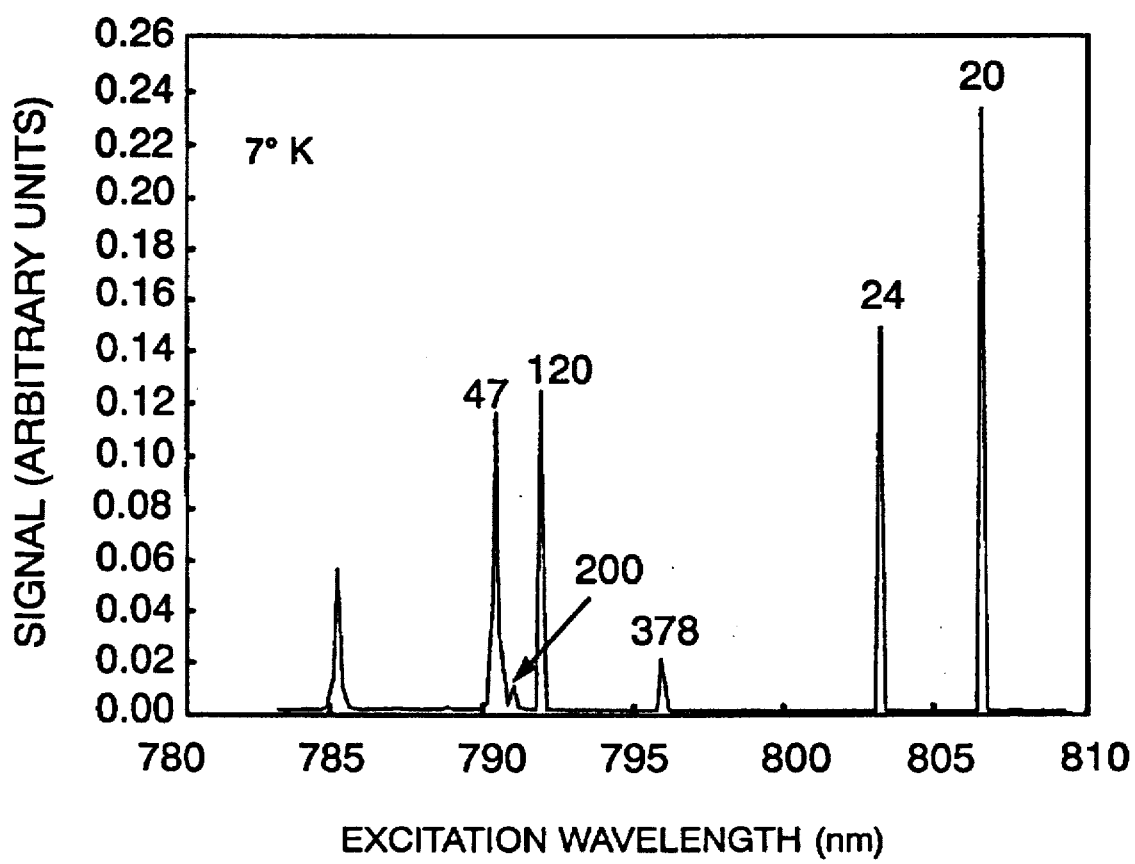
FIG. 7 shows the fluorescence excitation spectrum for Er:YALO taken at 7° K.

The fluorescence excitation spectrum for Er:YALO was taken at 7° K. and is illustrated in FIG. 7. The 550 nm fluorescence intensity is plotted as a function of the pump wavelength. The five strongest lines represent transitions from the lowest Stark level of the $^4I_{15/2}$ state to the five Stark levels of the $^4I_{9/2}$ state.

Laser performance measurements were taken using a first embodiment of this inventive concept illustrated in FIG. 1. The pump power required to reach threshold varied for the different excitation wavelengths illustrated in FIG. 7. The threshold pump power is indicated for each line in FIG. 7, where the number represents threshold power in milliwatts. The pump wavelengths for cooperative energy transfer upconversion at 7° K. are 806.9 nm, 803.5 nm, 792.2 nm, 790.6 nm and 785.4 nm.

Figure 8:
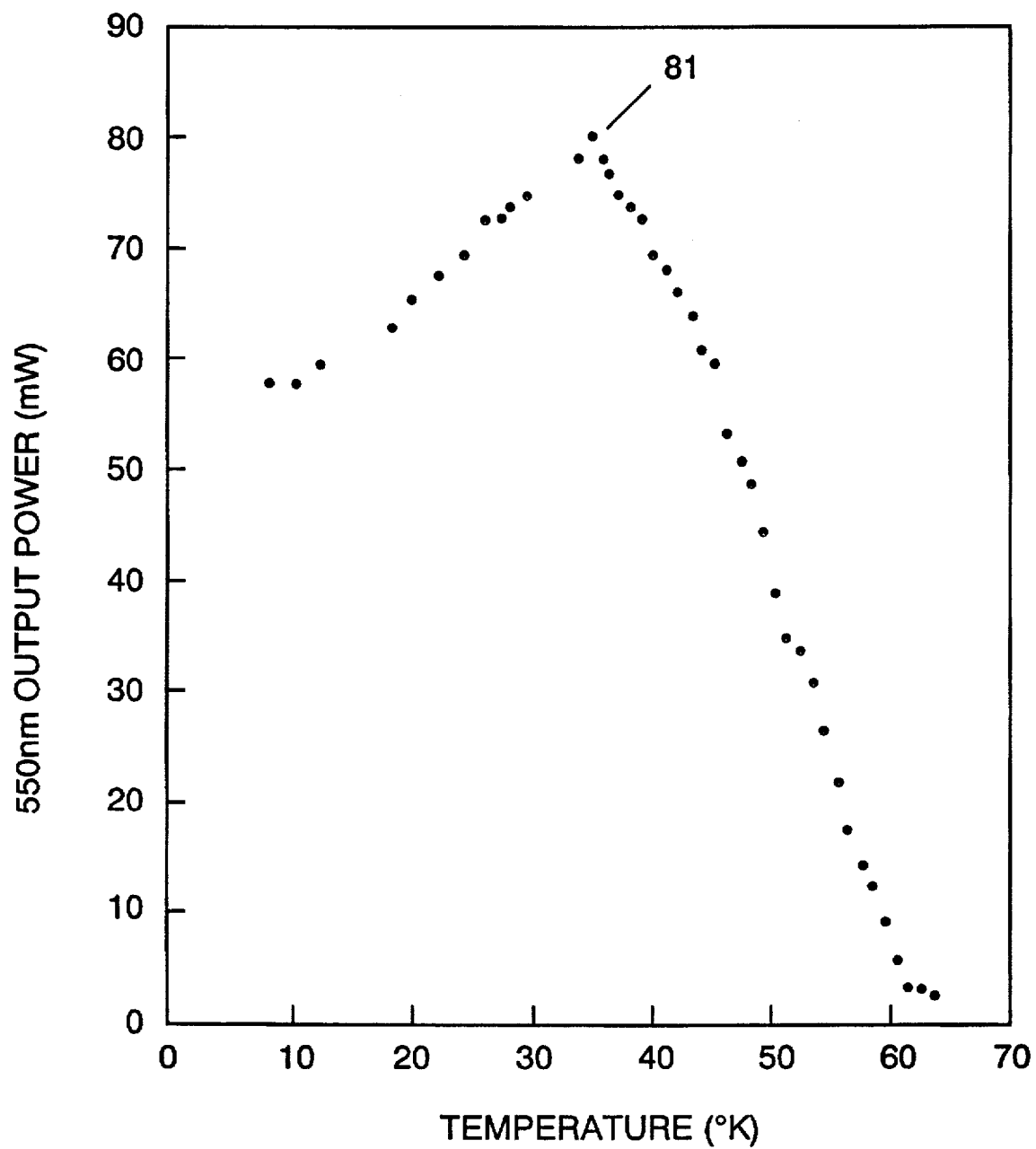
FIG. 8 shows the temperature dependence of upconversion laser emission in Er:YALO.

The temperature dependence of the upconversion laser output pumped by cooperative energy transfer upconversion is illustrated in FIG. 8. The highest output power 81 for upconversion pumping occurs at about at 34° K. As the temperature increases, the output power drops, and as the temperature decreases, the output power drops as well. The decrease in upconversion laser output power with temperature above 34° K. is believed to be due to the increase in ground state absorption that results from thermal population of the lower laser level. On the other hand, the decrease in laser output power as the temperature drops below 34° K. is due to the reduced efficiency of populating the upper laser level by cooperative energy transfer.

Figure 9:
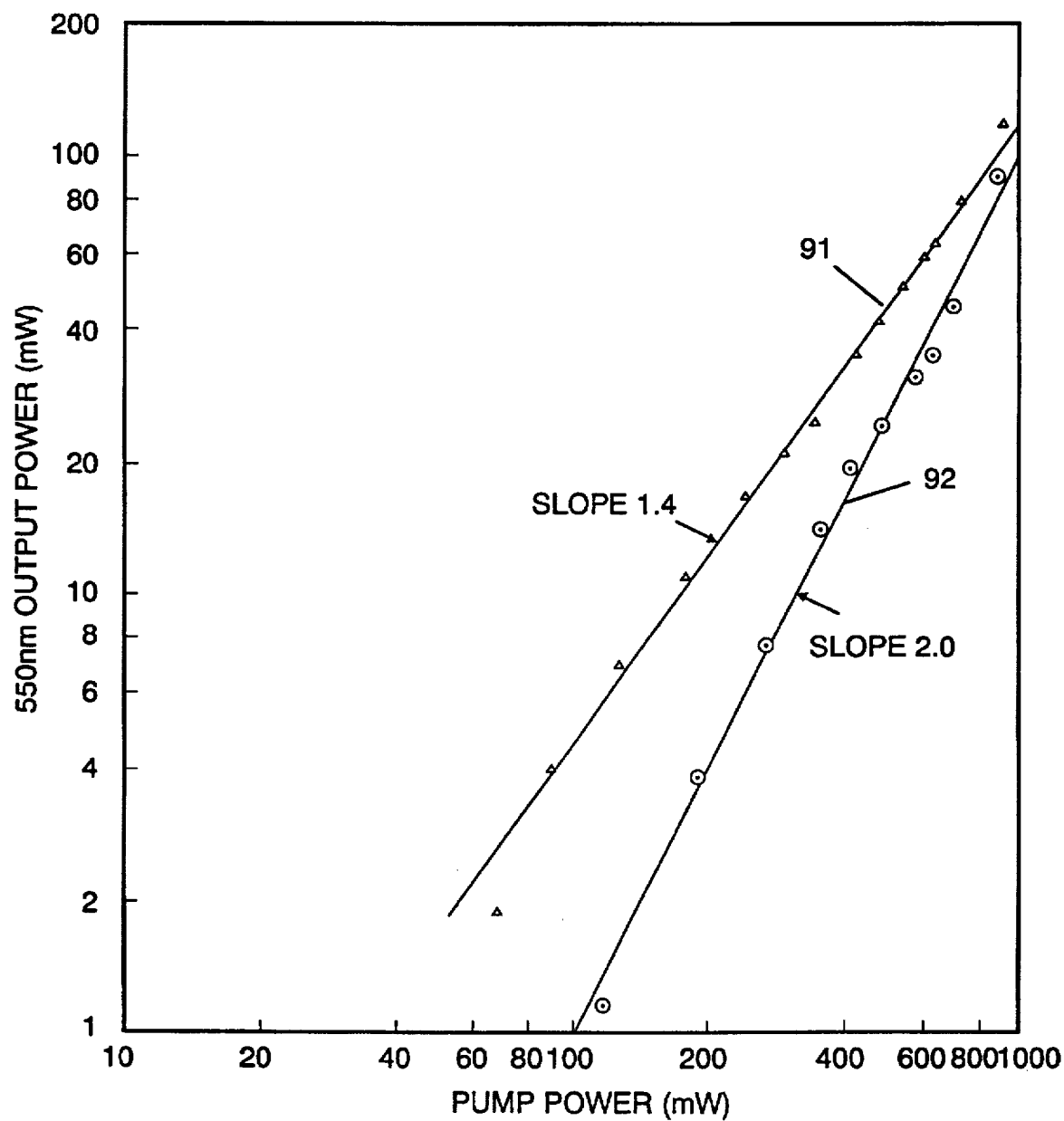
FIG. 9 shows the dependence of the upconversion laser emission on pump power.

The dependence of the upconversion laser output power on pump power is illustrated in FIG. 9. Upconversion laser emission may be produced by cooperative energy transfer in Er:YALO for excitation at 807 nm. The data points represented by small triangles indicate data taken at 34° K. and are fit by linear regression, as illustrated by straight line 91. The slope of this line is 1.4. The 7° K. data is indicated by circled dots and the linear regression fit is labeled 92. The slope of this line is 2. The axes in FIG. 9 are both logarithmic, so that the 7° K. data show a quadratic dependence of laser output power on pump power, while the 34° K. data exhibit a dependence that is less than quadratic. No indication of saturation of the output from upconversion laser 5 is observed up to a pump power of almost 1 W. The non-quadratic dependence of the 34° K. data indicates a change in the laser dynamics. The maximum laser upconversion output power illustrated in FIG. 9 was 121 mW for an absorbed pump power of 918 mW.

Figure 10:
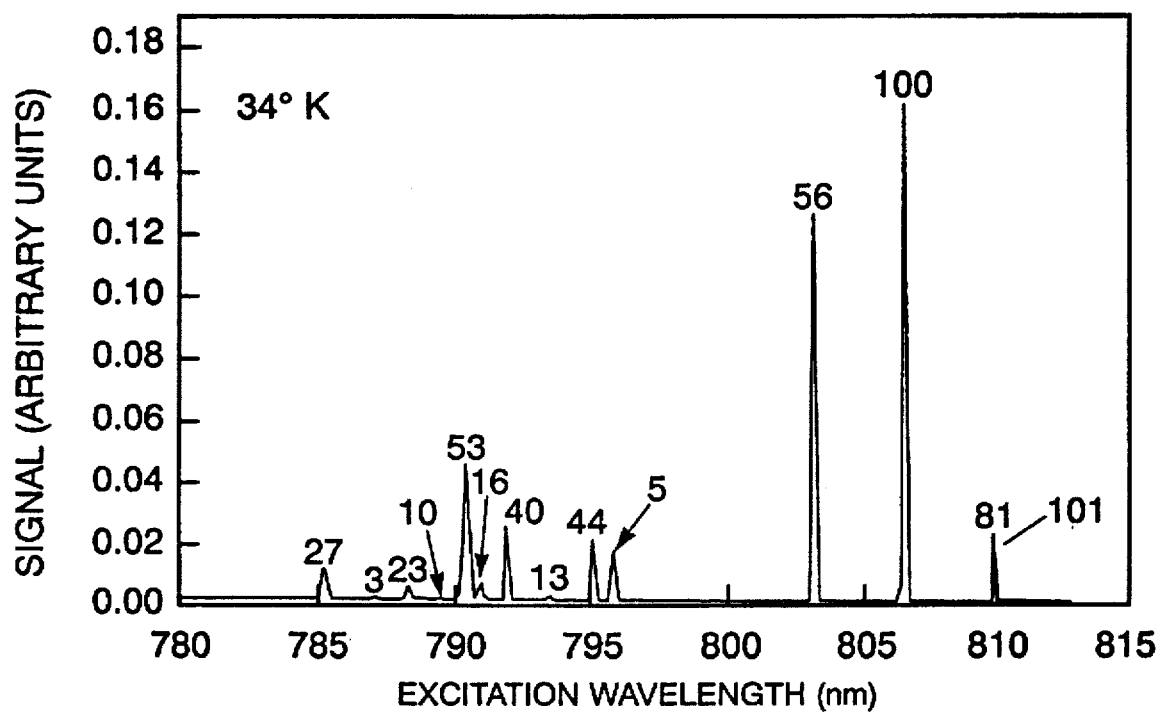
FIG. 10 shows the fluorescence excitation spectrum for Er:YALO taken at 34° K.

The fluorescence excitation spectrum was taken for Er:YALO at 34° K. and is shown in FIG. 10. Relative to the 7° K. fluorescence spectrum shown in FIG. 7, the data illustrated in FIG. 10 show the effect of thermal population of higher Stark levels in the ground state. For example, the peak at 810 nm labeled 101 results from excitation from the second Stark level of the $^4I_{15/2}$ ground state. The numbers indicated above each peak in FIG. 10 indicate the laser output power in milliwatts obtained for an incident pump power of 800 mW at each respective wavelength. The higher temperature data extend the absorption band for producing cooperative energy transfer upconversion to longer wavelengths. The longest wavelength that produced cooperative energy transfer upconversion at 34° K. was 810.2 nm.

The upconversion laser output wavelength was measured for each excitation wavelength illustrated in FIG. 10 using a commercial wavemeter. Emission at both 7° K. and 34° K. was measured. In Er:YLF, a fluoride based host, different excitation wavelengths in the 800 nm band produced different upconversion output wavelengths in the green. However, under all excitation conditions, the Er:YALO emission wavelength remained fixed at 550 nm.

The passive loss and small signal gain of the exemplary upconversion laser illustrated in FIG. 1 were measured using a standard Findlay-Clay analysis. This analysis was performed both at 7° K. and 34° K. using an excitation wavelength of 807 nm to produce cooperative energy transfer upconversion laser emission. The minimum absorbed threshold powers were 11 mW and 20 mW at 34° K and 7° K., respectively. For the 7° K. points, the small signal gain factor is 0.0024 mW$^{-1}$ and the round-trip passive loss is 2.5%. For the 34° K. data, the small signal gain factor is 0.0032 mW$^{-1}$ and the round-trip passive loss is 2.0%. To obtain the small signal gain coefficient from the Findlay-Clay data, the small signal gain factor is multiplied by the pump power in milliwatts (row).

Figure 11:
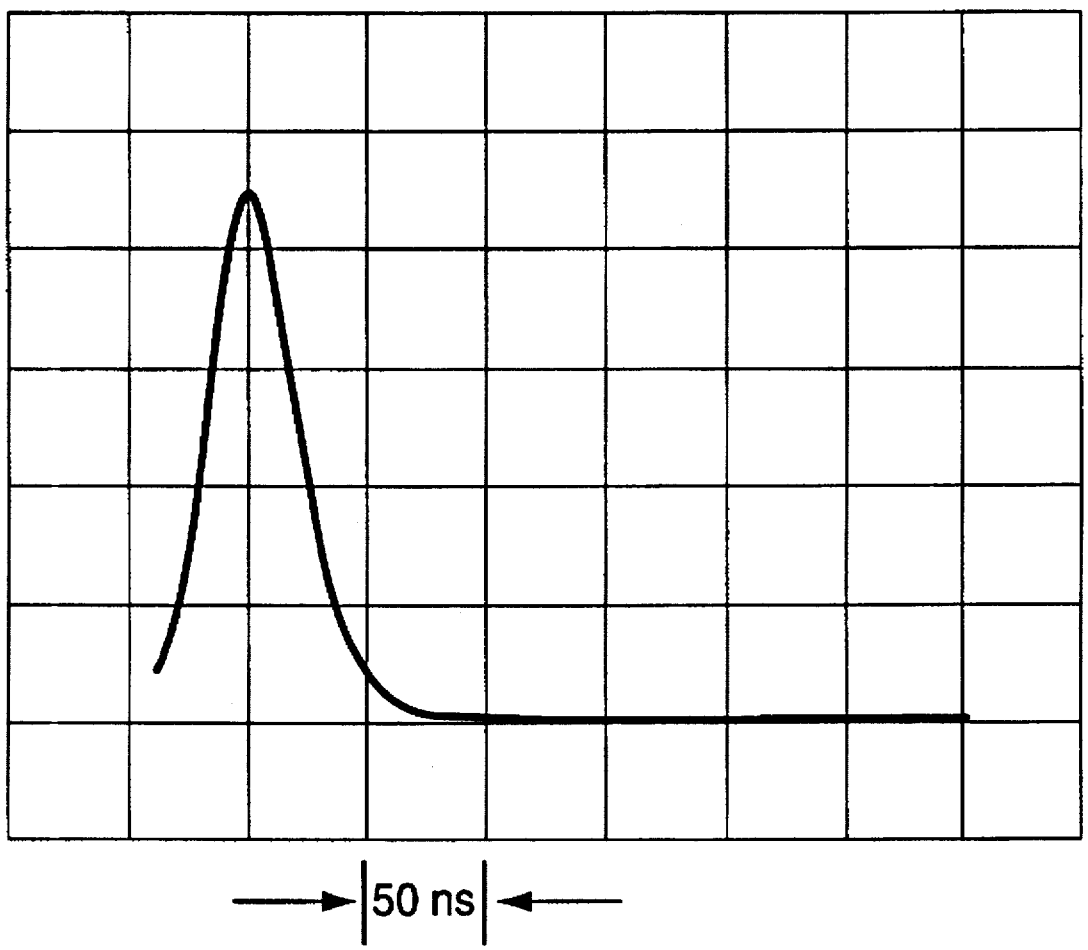
FIG. 11 shows a Q-switched output pulse from an Er:YALO upconversion laser.

Repetitively Q-switched upconversion laser emission was demonstrated using several different reflectivity output mirrors. The pump power and output mirror reflectivity were selected to obtain optimal coupling for Q-switched operation. For a discussion of Q-switched operation, see J. J. Degnan, *IEEE Journal of Quantum Electronics*, vol. 25, p. 214, 1989. An oscilloscope trace of the Q-switched pulse is illustrated in FIG. 11. With an absorbed power of 692 mW at 807 nm, the shortest pulse width achieved was 40 ns. At 7° K. the average Q-switched power at 3 kHz was 9.6 mW and represented 25% of the cw power obtained with the intracavity Q-switch turned off. Somewhat higher ratios of Q-switched to average power were measured at 34° K using lower reflectivity output mirrors. The best ratio of Q-switched to cw power obtained was 0.29 and the highest average Q-switched cw power obtained was 11 mW.

Figure 12:
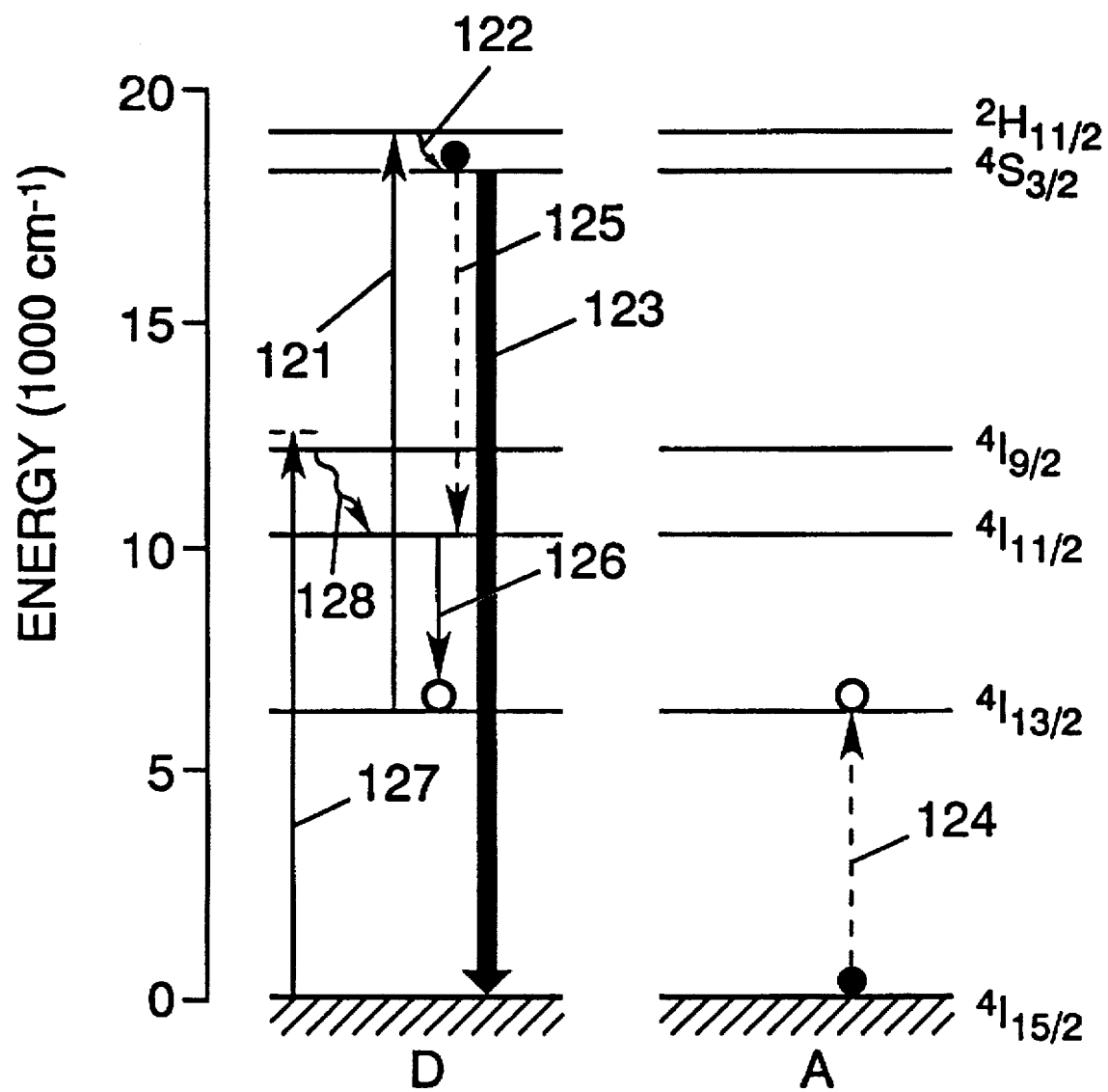
FIG. 12 shows the energy levels in a first mechanism for photon avalanche upconversion in Er:YALO.

Energy transport and photon processes involved in photon avalanche upconversion pumping in Er:YALO are illustrated in FIG. 12. The primary absorption process uses pump photons to produce the upper laser level. This process is indicated by arrow 121 in FIG. 12 and involves a transition from the $^4I_{13/2}$ state to the $^2H_{11/2}$ state. The $^4I_{13/2}$ state is a metastable state in Er:YALO. The energy levels indicated in FIG. 12 are for two identical neighboring ions; one is the donor ion, labeled D, and the other is the acceptor ion, labeled A.

Initially, the donor ion is in the $^4I_{13/2}$ metastable state while the acceptor ion is in the $^4I_{15/2}$ ground state. Absorption of a pump photon resonant with the $^4I_{13/2}$ to the $^2H_{14/2}$ state transition produces the $^4S_{3/2}$ upper laser level following non-radiative decay from the $^2H_{11/2}$ state. Non-radiative decay is indicated by wavy arrow 122. Ions in the $^4S_{3/2}$ state can radiate to the ground state, as indicated by heavy arrow 123, and this is the basis for laser emission in Er:YALO at 550 nm.

The process of photon absorption (indicated by arrow 121), followed by relaxation (indicated by arrow 122) and radiation (indicated by arrow 123), deplete population from the metastable $^4I_{13/2}$ state. An alternative for ions in the upper laser level is to undergo a quenching-type energy transfer interaction. In this case, part of the energy of the donor ion is transferred to the acceptor ion. The result of this process is to promote the acceptor ion to the metastable $^4I_{13/2}$ state, as indicated by dashed arrow 124, while de-exciting the upper laser level to the $^4I_{11/2}$ state, as indicated by dashed arrow 125. Subsequent radiative and non-radiative decay from the $^4I_{13/2}$ state brings the donor ion D back down to the metastable $^4I_{13/2}$ state as indicated by arrow 126. To summarize this energy flow pathway, absorption of a single photon is indicated by arrow 121, which is followed by relaxation arrow 122 and then quenching (which is also called cross-relaxation) indicated by dashed arrows 124 and 125, and finally radiative and non-radiative decay from the $^4I_{11/2}$ state indicated by arrow 126. This is the avalanche mechanism which produces two ions in the metastable $^4I_{13/2}$ state.

Put another way, the absorption of a single photon resonant with a transition from the metastable state in Er:YALO can produce two ions in the metastable state. The two ions can then produce four, the four can produce eight, and so on, until a sizable population is produced in the $^4I_{13/2}$ metastable state. Because of the multiplicative effect of the quenching process, a reasonably large population can be built up in the metastable level starting with a very low population in this metastable state.

The initial, low population in the metastable level that is required to initiate the photon avalanche process can be produced by non-resonant absorption. This is illustrated by arrow 127. In this case, a photon from the pump field, which is resonant with the transition indicated by arrow 121, can be absorbed with very low probability by the ground state ion, as indicated by arrow 127. Non-resonant absorption populates the $^4I_{9/2}$ state, which relaxes by non-radiative decay to the $^4I_{11/2}$ state, shown by wavy arrow 128. The $^4I_{11/2}$ state then decays to the metastable $^4I_{13/2}$ state, as indicated by arrow 126, producing the a low initial population in the metastable state.

Figure 13:
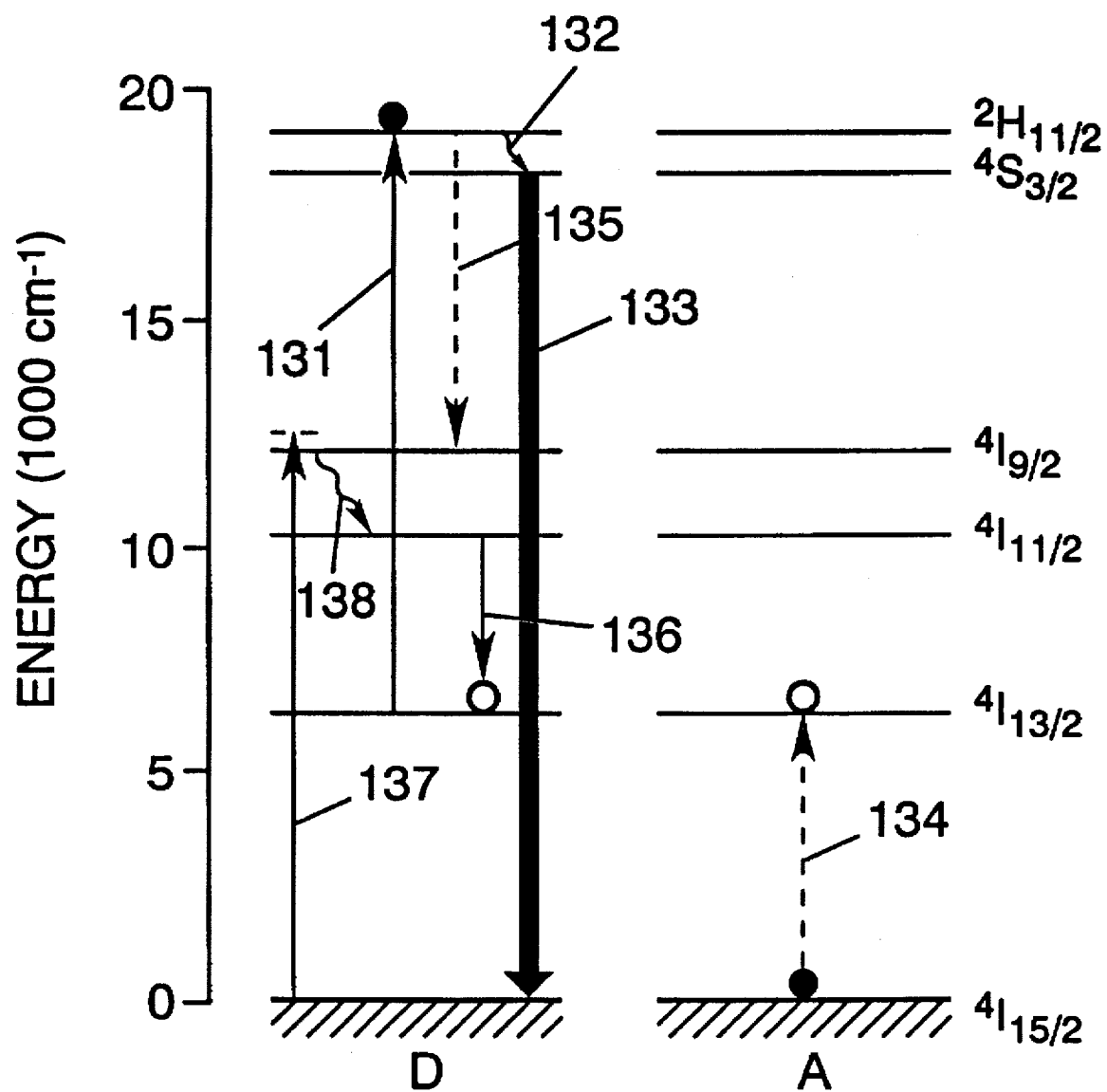
FIG. 13 shows the energy levels involved in a second mechanism for photon avalanche upconversion in Er:YALO.

An alternative path for cross-relaxation energy transfer that produces photon avalanche upconversion in Er:YALO involves the $^2H_{11/2}$ state and is illustrated in FIG. 13. In this process, the initial population in the $^4I_{13/2}$ metastable state occurs through non-resonant absorption and relaxation processes identical to those described in relation to FIG. 12. These processes are indicated by arrows 137 and 138, respectively. Absorption of a photon by donor ion D in the $^4I_{13/2}$ metastable state promotes donor ion D to the $^2H_{11/2}$ state, as in FIG. 12 and indicated by arrow 131. However, in this alternative process, cross-relaxation energy transfer, indicated by dashed arrows 134 and 135, involve the $^2H_{11/2}$ state directly. The product of this cross-relaxation or quenching process is the promotion of acceptor ion A from the ground state to the metastable state, as indicated by dashed arrow 134 and the de-excitation of the donor ion D to the $^4I_{9/2}$ state, as indicated by dashed arrow 135. Donor ion D in the $^4I_{9/2}$ state then relaxes to the $^4I_{11/2}$ state, as indicated by arrow 138, and undergoes a second decay, as indicated by arrow 136, to populate the metastable $^4I_{13/2}$ state.

Alternatively, an ion in the $^2H_{11/2}$ state can decay non-radiatively to the $^4S_{3/2}$ state, as illustrated by wavy arrow 132, populating the upper laser level. Green emission at 550 nm is then produced as illustrated by heavy arrow 133. The energy flow dynamics for photon avalanche in Er:YALO illustrated in both FIGS. 12 and 13 should include an initial population in the metastable state. In addition, the absorption of a photon populates the $^2H_{11/2}$ state in each mechanism. The distinction between the two illustrated energy flow mechanisms (FIGS. 12 and 13) is the specific excited level involved in the cross-relaxation energy transfer process that produces an avalanche of population in the metastable state. Since both mechanisms require population in the $^2H_{11/2}$ state and the $^4S_{3/2}$ state, it is possible that both mechanisms operate simultaneously and contribute to avalanche population in the metastable state.

The observation of upconversion emission resulting from pumping an upconversion gain element at a wavelength resonant only with transitions from a metastable state does not in and of itself indicate that photon avalanche upconversion is taking place. In fact, any of the three upconversion pump mechanisms can operate under the conditions where the pump wavelength is resonant with transitions only from the metastable state. Referring to FIG. 12, pumping with a wavelength resonant with the transition indicated by arrow 121 can produce upconversion emission by the following steps: non-resonant absorption indicated by arrow 127, followed by relaxation indicated by arrow by arrows 128 and 126, followed by a second absorption which is resonant and is indicated by arrow 121, a second relaxation step indicated by arrow 122, and finally, upconversion emission indicated by heavy arrow 123. Thus, irradiating the sample at a wavelength resonant only with transitions from the metastable state can produce non-resonant sequential two-step absorption upconversion.

As an alternative pumping technique, population in the $^4I_{11/2}$ state is produced both by non-resonant absorption, indicated by arrow 127 followed by relaxation 128, as well as by resonant absorption, indicated by arrow 121 followed by relaxation arrow 122 and then cross-relaxation, indicated by dashed arrow 125. As has been discussed above, neighboring ions in the $^4I_{11/2}$ state can undergo cooperative energy transfer to populate the $^4S_{3/2}$ emitting level. Therefore, pumping the Er:YALO crystal at a wavelength resonant with the transition indicated by arrow 121 in FIG. 12 can produce cooperative energy transfer upconversion. An important point relevant to all three mechanisms in which the pump wavelength is resonant with transitions from the metastable state is that the absorption of pump flux will be fairly low relative to absorption from the ground state. That is, only a small fraction of the incident pump flux is absorbed.

The avalanche process is a specific case of a more general energy flow scheme in which population in the metastable state is produced by cross-relaxation energy transfer; that is, in order for photon avalanche population of the metastable state to occur, the cross-relaxation rate coefficient must exceed the rate for decay from the upper state involved in cross-relaxation. This decay is normally fluorescence decay. Designating the cross-relaxation rate coefficient as $k_q$ and further designating the upper state involved in cross-relaxation energy transfer as level 3, and the metastable state as level 2, the condition for photon avalanche can be written $k_q > W_{32}$, where $W_{32}$ is the radiative decay rate from the upper level to the metastable state.

If the cross-relaxation rate coefficient $k_q$ is not greater than $W_{32}$, the mechanisms illustrated in FIGS. 12 and 13 will still take place; that is, population of the metastable state will still occur through quenching and relaxation processes illustrated in both figures. However, the avalanche effect will not take place and the steady state population in the metastable state will be lower than if avalanche population were occurring.

Figure 14:
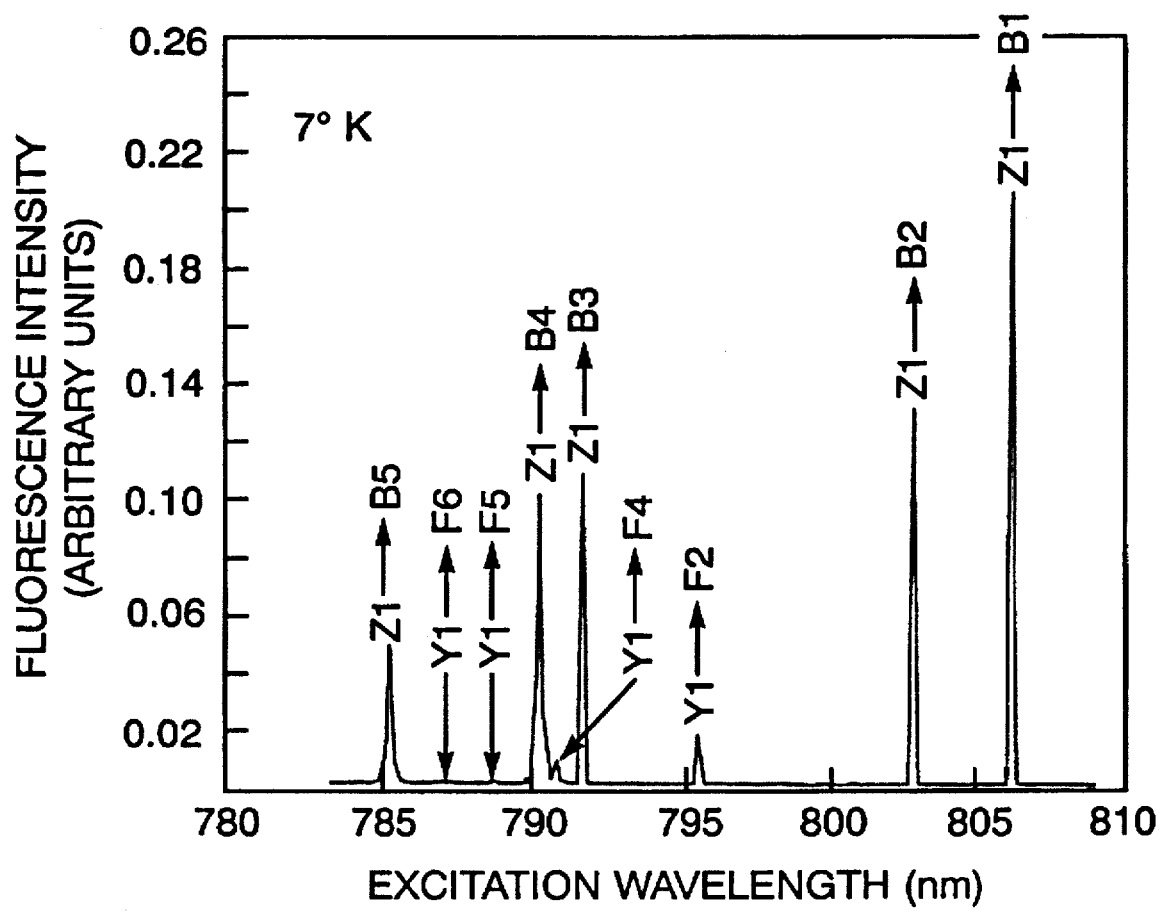
FIG. 14 shows a fluorescence excitation spectrum for Er:YALO.

FIG. 14 shows a fluorescence excitation spectrum of Er:YALO. The upconversion fluorescence emission is shown as a function of the pump wavelength. The fluorescence excitation lines labeled Zn→Bn indicate transitions from the ground state, as represented by arrows 41a or 41d in FIG. 4. The transitions labeled Yn→Fn originate in the metastable state, and are represented by arrows 121 or 131 in FIGS. 12 and 13, respectively. Four of the nine fluorescence excitation lines shown in FIG. 14 originate in the metastable state. The transition at 791.3 nm to the F4 level produces the most intense upconversion laser output in the configuration illustrated in FIG. 1.

Figure 15:
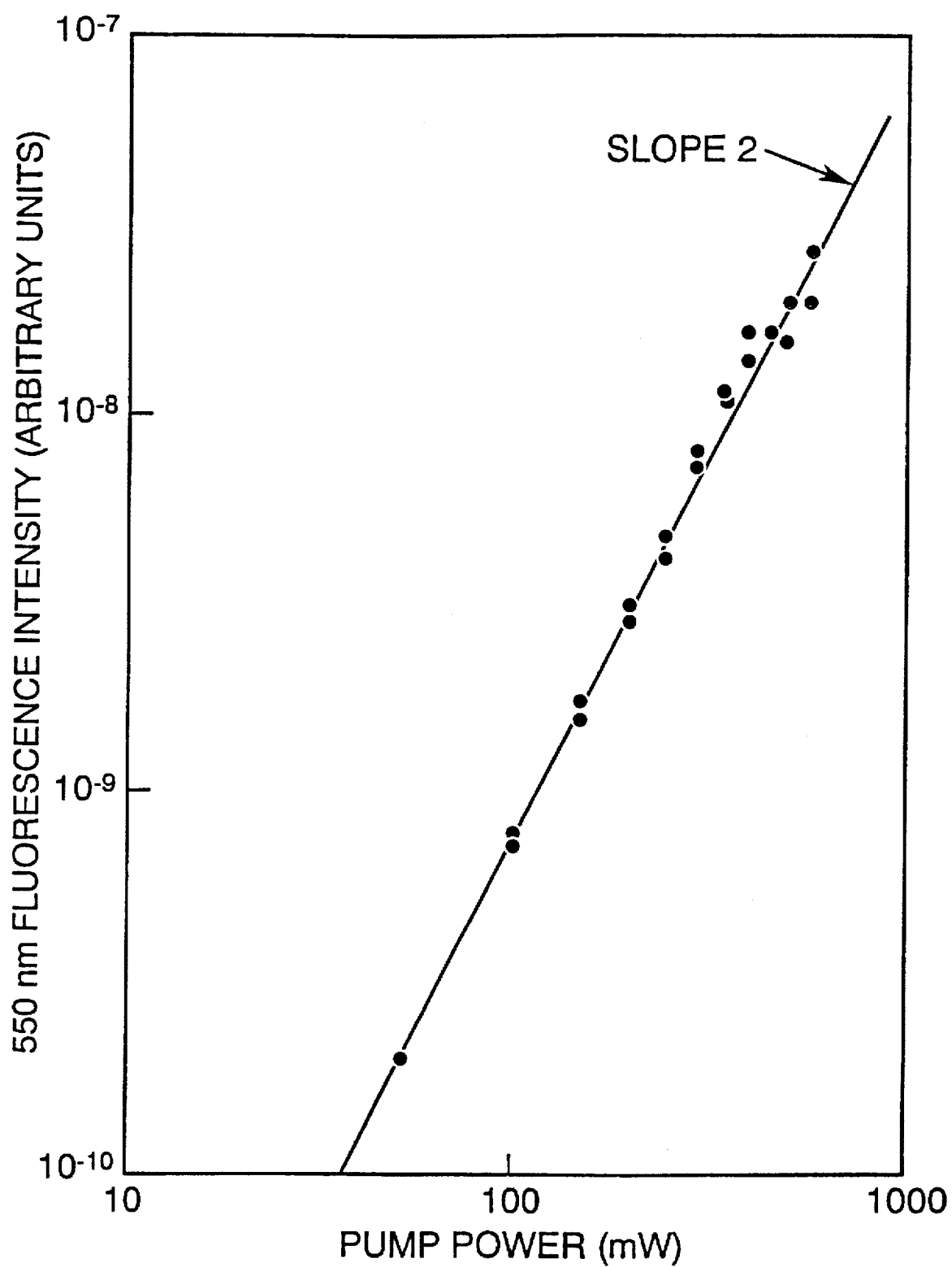
FIG. 15 shows the dependence of the upconversion fluorescence on pump power in Er:YALO.
Figure 16A:
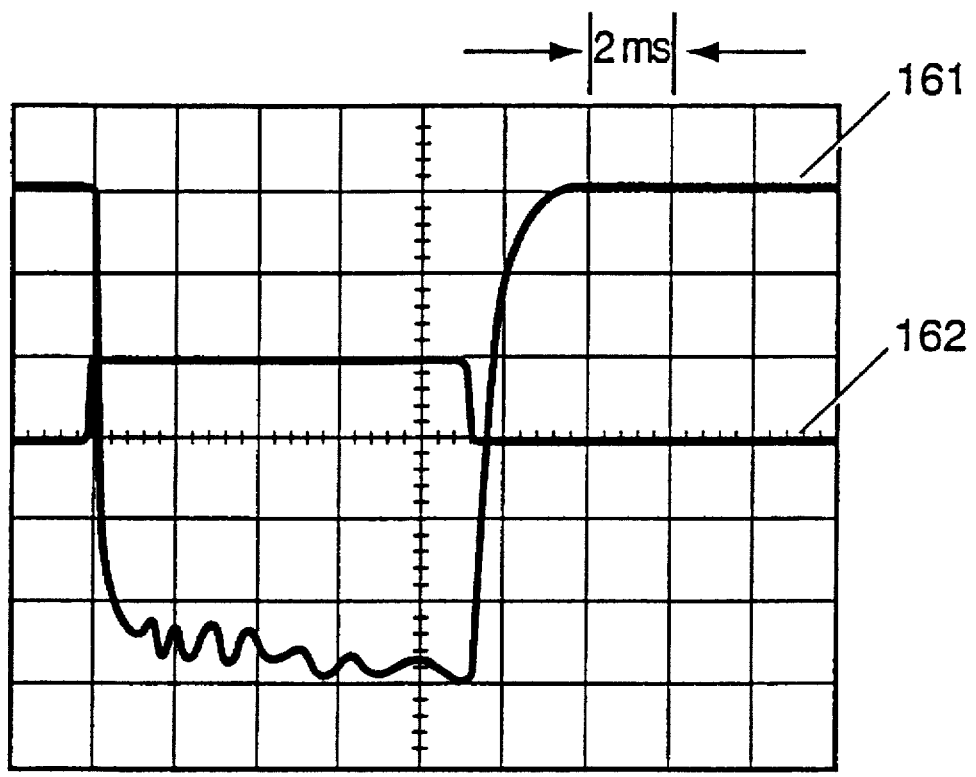
FIG. 16A shows the temporal dependence of the upconversion fluorescence in Er:YALO.

FIG. 15 illustrates the quadratic dependence of the 550 nm upconversion fluorescence intensity on pump power at 791.3 nm. The axes are logarithmic for both the ordinate and the abscissa. FIGS. 16A and B illustrate the difference in the temporal evolution of the 550 nm upconversion fluorescence for pulsed pumping using a pump wavelength resonant with the ground state and using a pump wavelength resonant with the metastable state. In FIG. 16A, curve 161 represents an oscilloscope trace of the 550 nm upconversion fluorescence output as a function of time. A photomultiplier tube detects the upconversion fluorescence emission and produces a negative voltage when light is incident upon it. Curve 161 displays the time dependence of the photomultiplier tube voltage. Curve 162 shows the pump pulse. A photodiode detects the pump laser emission and produces a positive voltage when light is incident upon it. Curve 162 displays the time dependence of the photodiode voltage. The pump wavelength used to obtain the oscilloscope traces in FIG. 16A is 807 nm and upconversion pumping occurs through cooperative energy transfer. The 550 nm fluorescence increases rapidly, reaching a steady state value within approximately 2 ms after the pump emission pulse is turned on. In addition, when the pump pulse is terminated, the decay of the 550 nm fluorescence shows a long decay time, indicating that the levels involved in cooperative upconversion continue to feed the upper emitting level after the pump emission pulse has terminated.

Figure 16B:
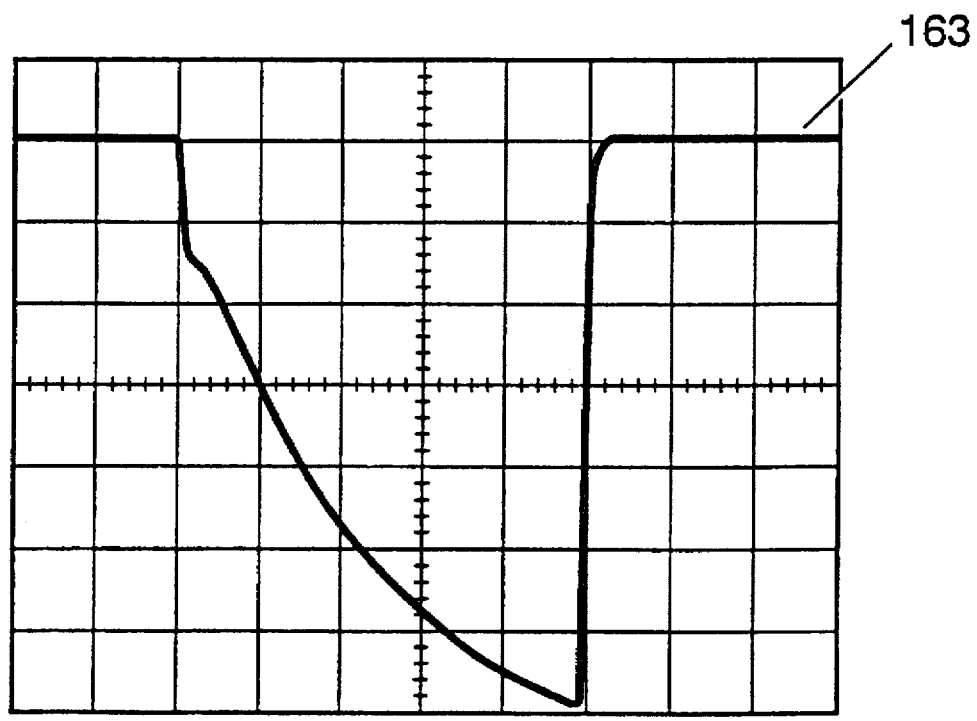
FIG. 16B shows the temporal dependence of the upconversion fluorescence in Er:YALO.

The oscilloscope trace illustrated in FIG. 16B shows the temporal evolution of the 550 nm upconversion fluorescence pulse when the Er:YALO sample is pumped at 791.3 nm. Curve 163 represents an oscilloscope trace of the 550 nm upconversion fluorescence output as a function of time. A photomultiplier tube detects the upconversion fluorescence emission and produces a negative voltage when light is incident upon it. Curve 163 displays the time dependence of the photomultiplier tube voltage. The rise of the fluorescence is quite long, taking over 10 ms to reach steady state. This reflects the relatively long lifetime of the $^4I_{13/2}$ metastable state (7.2 ms). In addition, the decay of the fluorescence illustrated by curve 163 in FIG. 16B is more rapid than in curve 161, illustrating that when the pump flux is terminated, there is no mechanism to promote ions from the metastable state to the upper emitting state.

To evaluate laser performance under conditions where the pump flux is resonant with transitions from the metastable state, the hemispherical laser resonator of upconversion laser 5 was used. All of the wavelengths that generated fluorescence excitation peaks at 7° K. shown in FIG. 14 produced laser emission. With an incident pump power of approximately 900 mW from pump laser 12 and an output coupler reflectivity of 0.90, between 6 mW and 33 mW of 550 nm laser output power were obtained using Er:YALO upconversion laser crystal 10 and pump wavelengths corresponding to the four Y1 transitions illustrated in FIG. 14. The four pump wavelengths are 787.4 nm, 789.1 nm, 791.3 nm and 796.2 nm.

Figure 17:
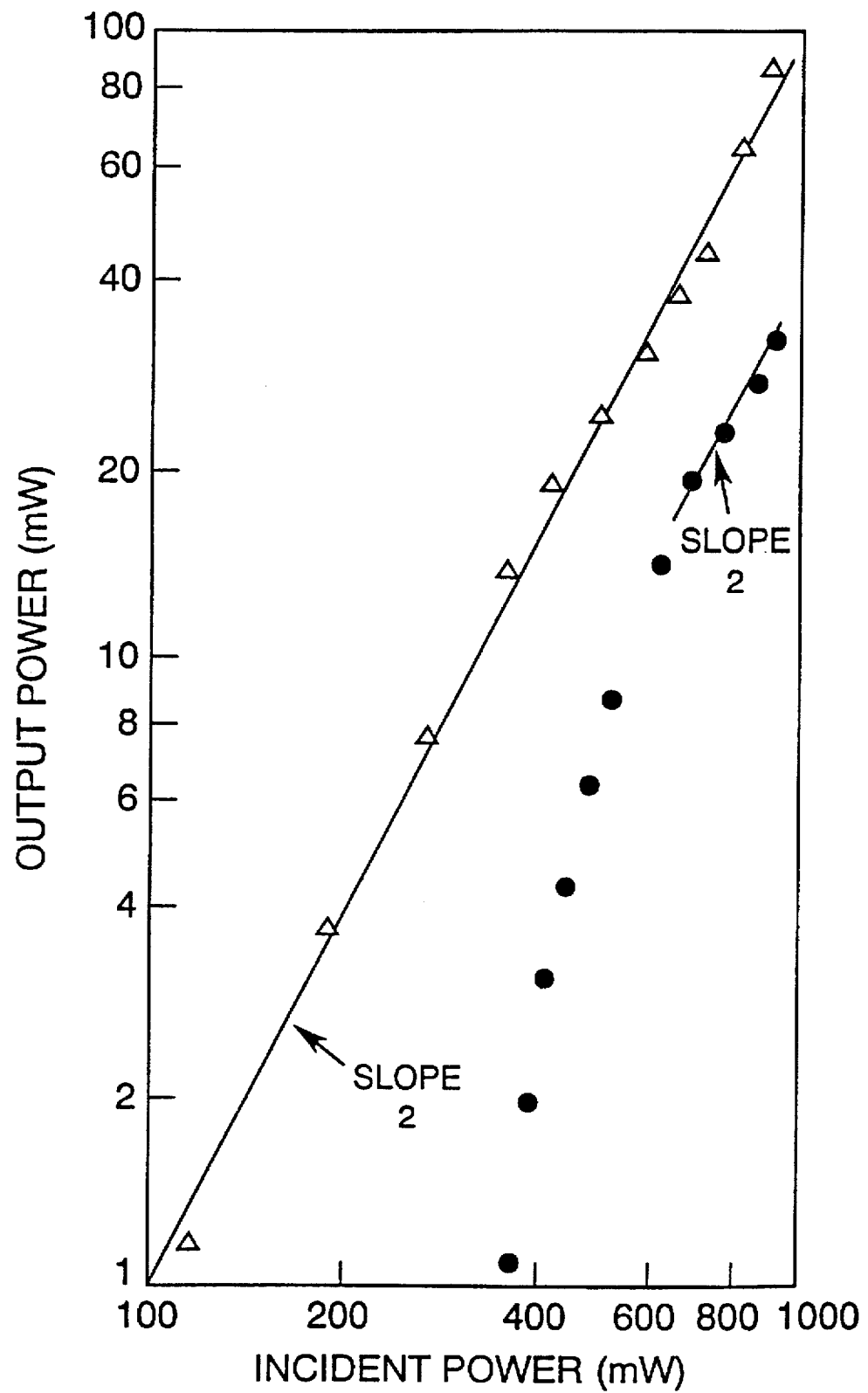
FIG. 17 shows the dependence of the laser output power on pump power for Er:YALO.

The variation of laser output power form upconversion laser 5 with pump power from pump laser 12 is illustrated in FIG. 17. The Er:YALO output power is highly sensitive to the 791.3 nm pump power near laser threshold, but the dependence becomes quadratic at higher pump power. The 791.3 nm data, indicated by the solid dots in FIG. 17, are substantially different than the laser output variation when upconversion pumping is by cooperative energy transfer upconversion. The latter pump mechanism dominates when the pump wavelength is 806.9 nm. As can be seen in FIG. 17, where the data for 806.9 pumping is illustrated by open triangles, the dependence is quadratic over the entire range of pump power used. The axes in FIG. 17 are logarithmic and a slope of 2 corresponds to a quadratic dependence.

The difference in laser threshold power for the two pump wavelengths represented in FIG. 17 is due to the low fraction of pump power absorbed at 791.3 nm. With 853 mW of pump power, an exemplary 33 mW of laser output power was obtained. The optical conversion efficiency was 3.9%. Only a small fraction of the incident power is absorbed, as the steady state population in the $^4I_{13/2}$ state is relatively low. At the maximum pump power, only about 13% of the incident power is absorbed, so that the optical conversion efficiency is 30% based on the absorbed power. Pumping at 807 nm through the mechanism of cooperative energy transfer upconversion, an exemplary 166 mW of output power is produced in Er:YALO. Over 90% of the incident pump power is absorbed at 807 nm, and the optical conversion efficiency is 17%.

Referring once again to upconversion laser 5 illustrated in FIG. 1, the maximum powers obtained by pumping with pump wavelengths in the 800 nm band of Er:YALO are 8 mW for sequential two-photon absorption, 166 mW for pumping by cooperative energy transfer upconversion, and 33 mW for pumping by photon avalanche. These upconversion laser output powers for Er:YALO represent increases in output power ranging between 10 times and 200 times that reported previously. See, for example, Silversmith et al., cited previously. The improved efficiency, as well as obtaining the highest optical conversion efficiency reported to date for any upconversion laser, is due to the improved performance of this inventive concept. The upconversion laser having the hemispherical resonator illustrated as a first embodiment of this inventive concept and shown in FIG. 1 provides the ability to match the laser resonator mode with the pump mode to create a $TEM_{00}$ gain aperture, as well as to produce the highest pump intensity and laser resonator intensity.

Figure 18:
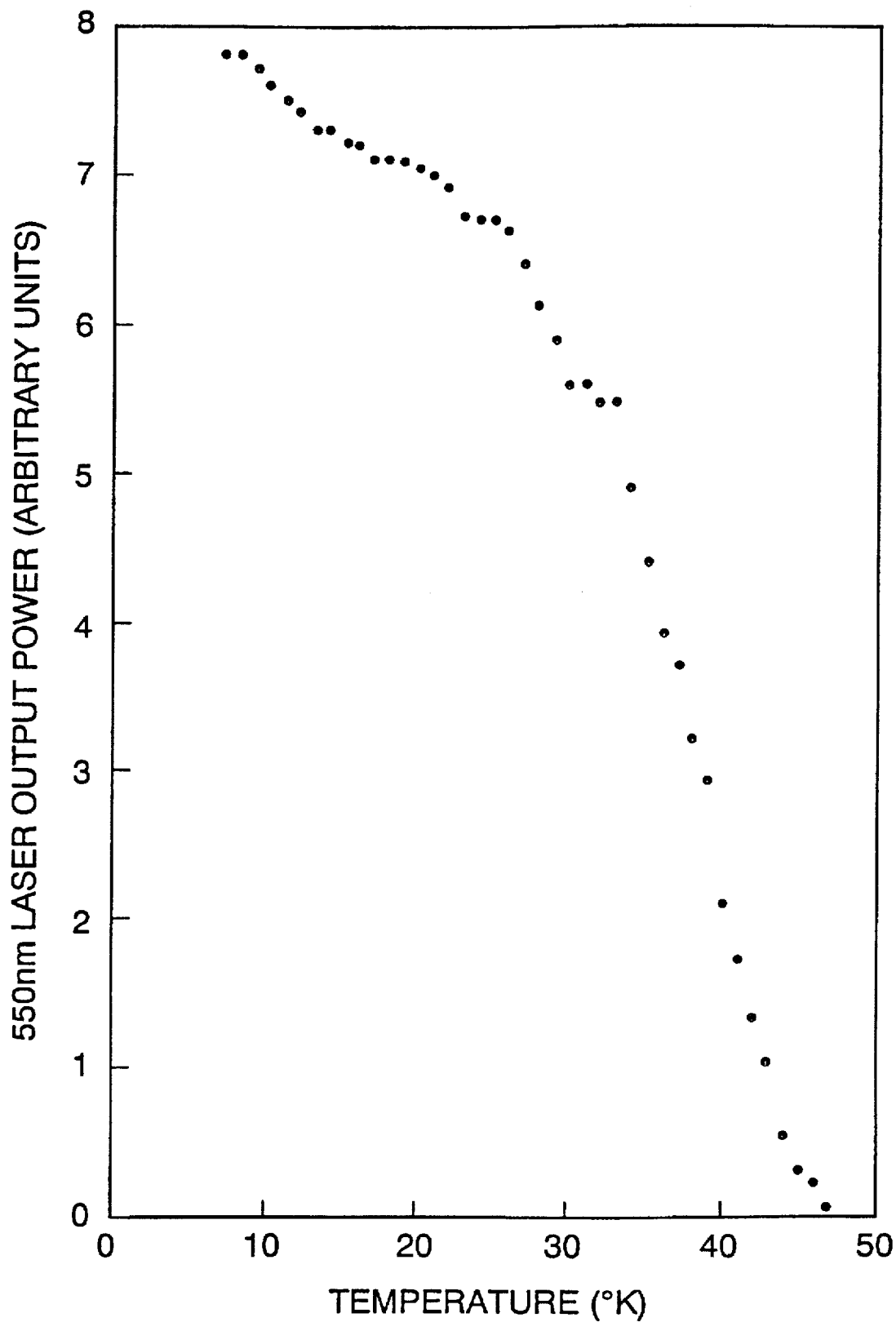
FIG. 18 shows the dependence of the upconversion laser output on temperature for Er:YALO.

The variation of the output power with crystal temperature was measured for pump wavelengths resonant with the metastable state and is shown in FIG. 18 for pumping at 791.3 nm. The data are indicated with solid dots. The laser output power drops monotonically with crystal temperature, in contrast to the variation of the laser output power for cooperative energy transfer upconversion pumping at 807 nm. In the latter case, shown in FIG. 8, the temperature dependence is governed by the competing processes of thermal population of the terminal laser level and the increase in the cooperative energy transfer rate. For either pump wavelength the laser output wavelength is not affected by the crystal temperature.

Referring once again to FIG. 1, cryostat windows 13w and 13w' are preferably AR coated on both surfaces at the upconversion laser output wavelength and pump wavelength, respectively. Small reflective or scattering losses in cryostat window 13w' do not greatly affect the overall laser efficiency, but because cryostat window 13w is contained within the laser resonator cavity, small insertion losses caused by cryostat window 13w may have a substantial effect on the total laser output efficiency.

Hemispherical laser resonator mode 17 is collimated as it passes through cryostat window 13w by appropriate adjustment of the spacing of output mirror 15 with respect to exterior face 10e of Er:YALO upconversion laser crystal 10, as well as the position of cryostat window 13w with respect to interior face 10i of Er:YALO upconversion laser crystal 10. However, this adjustment may increase the dimensions of laser resonator mode waist 11. The better the collimation of laser resonator mode 17 when passing through intracavity cryostat window 13w, the less reduction in laser efficiency due to residual reflections from surfaces of cryostat window 13w.

Figure 19:
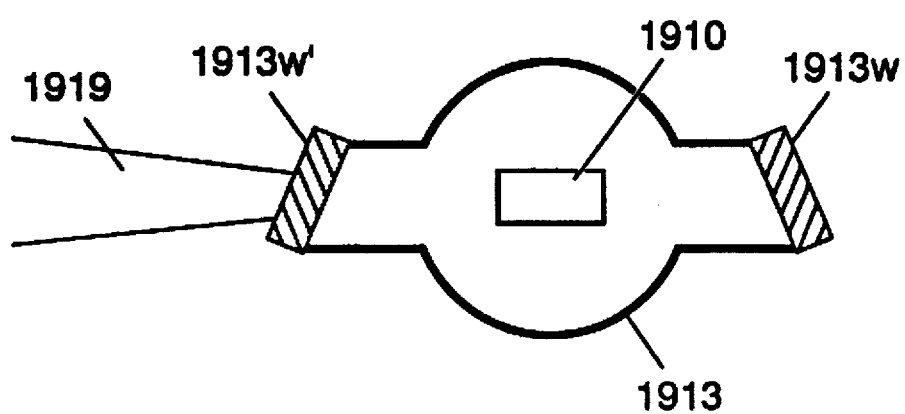
FIG. 19 illustrates a second embodiment of the upconversion laser of the present invention.

In FIG. 19, insertion loss of the intracavity cryostat window may be further reduced. In this embodiment, the surface of intracavity window 1913w is oriented at Brewster's angle with respect to the longitudinal axis of the hemispherical laser resonator mode of light. For Er:YALO as well as many other upconversion laser gain elements the upconversion emission is plane-polarized. By appropriate orientation of intracavity window 1913w with respect to the crystalline axes of upconversion laser gain element 1910 contained within cryostat 1913, the percentage of intracavity intensity reflected by intracavity window 1913w can be reduced to approximately zero. The focused pump beam 1919 is also plane-polarized. The cryostat input window 1913w' can be oriented at Brewster's angle to the longitudinal axis of the pumping radiation to transmit approximately 100% of the pump light contained in focused pump beam 1919.

In this manner the resonator passive losses due to reflections from intracavity window 1913w can be substantially reduced while the transmission of cryostat input window 1913w' for the pump flux can be substantially increased. Although both intracavity window 1913w and cryostat input window 1913w' are illustrated in FIG. 19 for parallel orientation of the plane of the pump polarization relative to that of the upconversion laser emission, cryostat input window 1913w' can be aligned so that any orientation of the polarization of focused pumping beam 1919 can be accommodated without changing the orientation of intracavity window 1913w.

Figure 20:
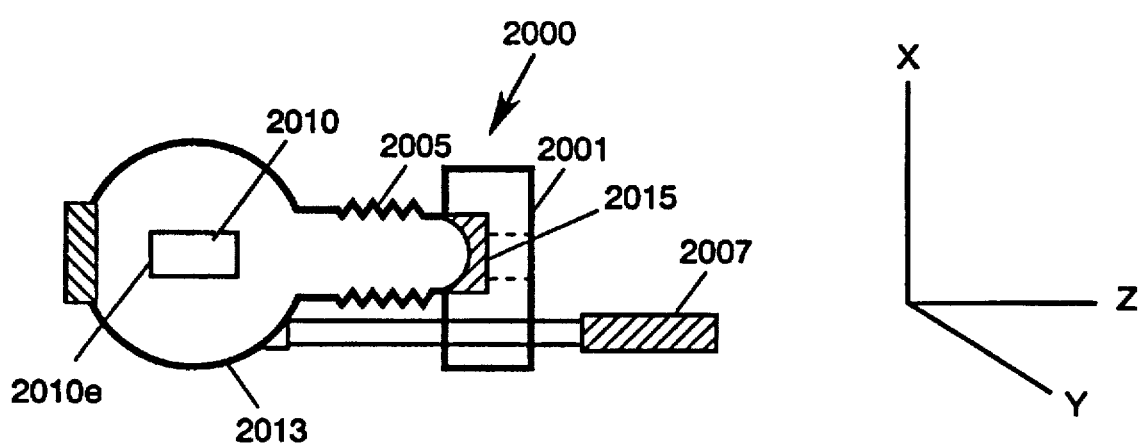
FIG. 20 illustrates a third embodiment of the upconversion laser of the present invention.

FIG. 20 shows an embodiment of the present invention suitable for cases where the laser output is unpolarized or where the Brewster orientation of intracavity window 1913w illustrated in FIG. 19 is inappropriate. In FIG. 20, output coupler mirror 2015 is contained in flange 2001, which is attached by a displaceable conduit such as a flexible bellows 2005 to cryostat 2013. By use of standard vacuum techniques, output mirror 2015 can form a vacuum seal to flange 2001. The embodiment illustrated in FIG. 20 eliminates the need for an intracavity cryostat window.

Flexible bellows 2005 can be adjusted in its angular orientation with respect to highly reflective face 2010e of upconversion laser gain element 2010 using the micrometer labeled 2007, for example. Translation of output coupler mirror 2015 along the mutually orthogonal x, y and z axes illustrated in FIG. 20, as well as angular rotation about the x and y axes, can be accomplished with suitable mechanical attachments such as additional micrometers or precision screws (not shown). The appropriately designed system will have flexible bellows 2005 be a vacuum type ("vacuum bellows") and flexible enough to provide the desired degree of translation and rotation. Other configurations, other than the bellows could be substituted such as telescoping tubes or other displacable hollow structures, for example, which are of sufficient strength to position mirror 2015 and maintain a vacuum. Irrespective which design is selected, once the proper orientation of output coupler mirror 2015 is obtained, rigid clamping is important to prevent vibrations and other motion that would misalign the laser resonator 2000. The embodiment illustrated in FIG. 20 has an intracavity Q-switch located within the vacuum chamber contained within cryostat 2013.

Figure 21:
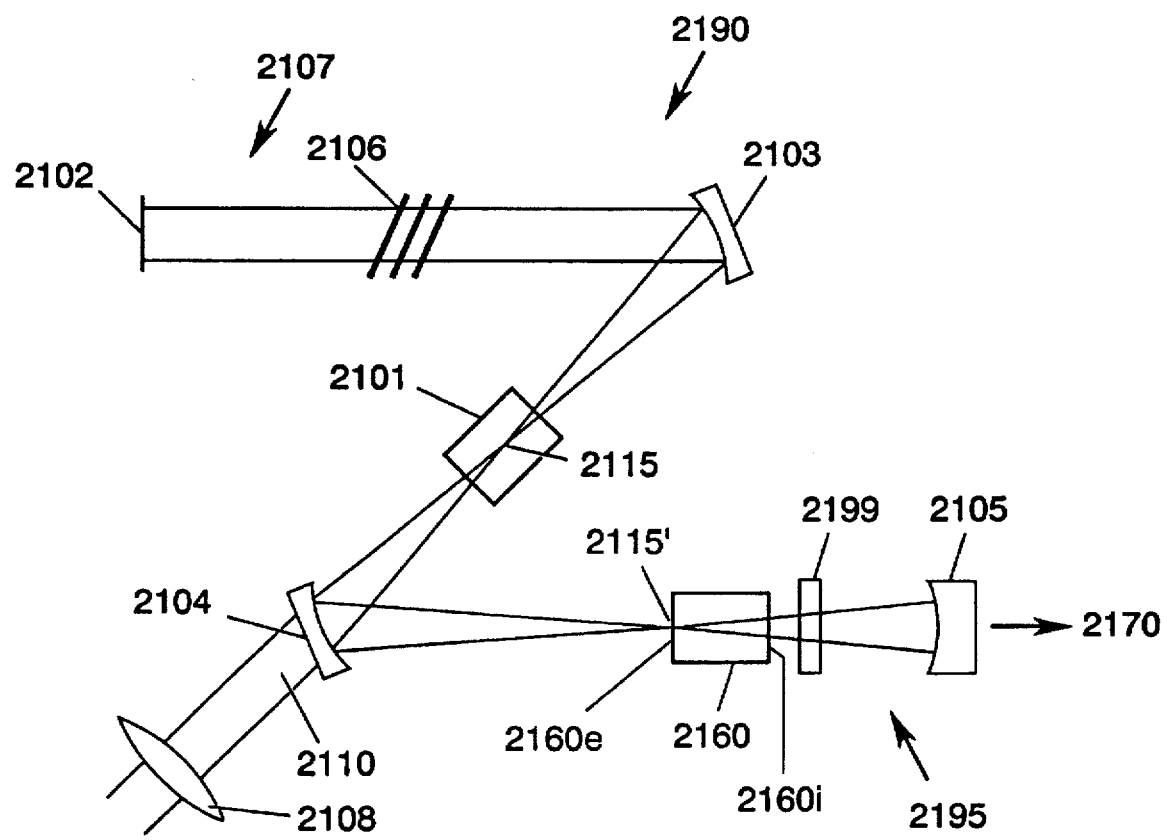
FIG. 21 illustrates a fourth embodiment of the upconversion laser of the present invention.

In FIG. 21, the upconversion laser gain element is located inside the pump laser cavity and is pumped by the emissions of the intracavity pump. This design is appropriate for upconversion laser materials which do not strongly absorb pump emission. In FIG. 21, upconversion laser gain element 2160 is contained within laser resonator cavity 2107 of the pump laser and forms a second, nested laser resonator which overlaps part of laser resonator cavity 2107. Pump laser gain element 2101, which may be a tunable pump laser gain element or a fixed frequency pump laser gain element, is contained within laser resonator cavity 2107 defined by four highly reflective mirrors: flat mirror 2102, concave fold mirror 2103, a second concave fold mirror 2104 and a concave output coupler mirror 2105. Tuning element 2106, which may be a birefringent filter, a prism, grating or other suitable tuning device, is placed within laser resonator cavity 2107.

The laser resonator mode produced in laser resonator cavity 2107 has a collimated region located between flat mirror 2102 and concave fold mirror 2103, and also contains two focused sections. The first focused section is located between concave fold mirror 2103 and concave fold mirror 2104, and the second focused section is located between concave fold mirror 2104 and concave output coupler mirror 2105. A pump beam 2110 of pumping emission from a pumping source (not shown) is focused by lens 2108 and optically pumps pump laser gain element 2101. The pump emission is focused to be concentrated in a pump waist in the center of pump laser gain element 2101. One laser resonator mode waist or focus occurs in the center of pump laser gain element 2101 and is labeled 2115.

Upconversion laser gain element 2160 is located at second laser resonator mode waist 2115'. Longitudinal positioning of laser gain element 2160 is adjusted so that exterior face 2160e is located at the position of second laser resonator mode waist 2115'. Upconversion laser gain element 2160 produces upconversion emission. Exterior face 2160e of upconversion laser gain element 2160 is coated to be highly reflective at the wavelength of the emission produced by upconversion laser gain element 2160 and highly transmissive at the wavelength of the emission produced by pump laser gain element 2101. Interior face 2160i of upconversion laser gain element 2160 is coated to be antireflective at both the wavelength of the emission produced by upconversion laser gain element 2160 and highly transmissive at the wavelength of the emission produced by pump laser gain element 2101. Flat mirror 2102, concave fold mirrors 2103 and 2104, and concave output coupler mirror 2105 are coated to be highly reflective at the pump wavelength produced by pump laser gain element 2101 at the appropriate angles of incidence. In addition, concave output coupler mirror 2105 is coated to be partially reflective at the wavelength of the emission produced by upconversion laser gain element 2160.

The upconversion laser resonator is formed between exterior face 2160e of upconversion laser gain element 2160 and concave output coupler mirror 2105. The output of the upconversion laser emission is produced along direction 2170. Partial reflections of flux at the pump wavelength by exterior face 2160e are mode matched to the laser resonator mode produced by pump laser gain element 2101 and therefore introduce virtually no loss to the operation of laser 2190 at the wavelength produced by pump laser gain element 2101.

In FIG. 21, laser 2190, comprising flat mirror 2102, concave fold mirrors 2103 and 2104, concave output coupler mirror 2105, tuning element 2106, and pump laser gain element 2101 are arranged to produce pumping radiation suitable for upconversion pumping of upconversion laser gain element 2160. Laser gain element 2160 may then be inserted in laser resonator cavity 2107 and its position is adjusted and oriented with respect to second laser resonator mode waist 2115' and concave output coupler mirror 2105 to establish a hemispherical laser resonator mode 2195 extending from exterior face 2160e to concave output coupler mirror 2105. Hemispherical laser resonator mode 2195 is coincident with the laser resonator mode of laser 2190 but oscillates at the upconversion laser output wavelength and produces upconversion laser emission along direction 2170.

If the absorption by upconversion laser gain element 2160 at the wavelength produced by pump laser gain element 2101 is too high, the insertion loss introduced by placing upconversion laser gain element 2160 in laser resonator cavity 2107 will be too high for operation. Factors that affect the absorption by upconversion laser gain element 2160 are the absorption coefficient at the pump wavelength of the activator ion in upconversion laser gain element 2160, the concentration of activator ions in the specific Stark level of the electronic state from which absorption occurs, and the length of upconversion laser gain element 2160 along the direction of the propagation of the pump flux. In general, the single pass absorption should be below 10% of the incident pump flux.

In addition, frequency pulling effects may occur. These effects shift the pump wavelength produced by pump laser gain element 2101. The shift is to a wavelength for which the absorption by upconversion laser gain element 2160 is not as strong. Small frequency pulling effects may not affect the overall operating efficiency of laser 2190 as long as a sufficient fraction of the intracavity pump emission is absorbed by upconversion laser gain element 2160.

A suitable pump laser gain element 2101 may be a Ti:sapphire laser gain element and a suitable pumping source to produce pump beam 2110 can be an argon ion laser or a doubled Nd:YAG laser or a copper vapor laser, for example. Upconversion laser gain element 2160 may be contained within a cryostat, with appropriate dichroic anti-reflection coatings placed on both surfaces of the intracavity windows of the cryostat as has been discussed in relation to the embodiment illustrated in FIG. 1. Alternatively, Brewster windows may be used on a cryostat similar to the windows illustrated in FIG. 19, or concave mirror 2105 may be attached by a flexible vacuum bellows to a cryostat similar to the arrangement illustrated in FIG. 20.

Tuning element 2106 should introduce large losses for non-selected wavelengths. Because of the frequency pulling effects discussed above, laser 2190 will have a tendency to operate at a wavelength slightly shifted from an absorption line of the activator ions in upconversion laser gain element 2160. If the losses introduced by tuning element 2106 for slightly off-resonant operation of laser 2190 are sufficiently high, then laser 2190 will operate at the center wavelength of the absorption line of upconversion laser gain element 2160. Laser resonator cavity 2107 is doubly-resonant, supporting oscillation at both the pump wavelength produced by pump laser gain element 2102 and upconversion laser wavelength produced by upconversion laser gain element 2160.

Q-switch 2199 can be inserted into laser resonator cavity 2107 to produce a Q-switched upconversion laser output. Q-switch produces a repetitive Q-switching of the intracavity optical flux produced by pump laser gain element 2101. Q-switch 2199 may be, for example, a mechanical shutter, an electrooptic or acoustooptic Q-switch, or other means suitable for producing repetitively Q-switched operation of laser 2190.

With Q-switch 2199 operating, the intracavity pump flux, which pumps upconversion gain element 2160, is repetitively Q-switched. If the pulse build-up time for upconversion laser output is short compared to the opening and closing cycle of Q-switch 2199, then a Q-switched upconversion laser output pulse will be produced by upconversion laser gain element 2160 in direction 2170.

Shortly after Q-switch 2199 opens, a Q-switched emission pulse at the pumping wavelength is produced in laser 2190. Part of the pump pulse energy is absorbed by upconversion laser gain element 2160. With a coating of appropriate reflectivity at the upconversion laser wavelength applied to output coupler mirror 2105, the upconversion laser output produced by laser 2190 can be gain switched. In general, gain switching allows the production of a short laser output pulse when the laser gain element is optically pumped by a short pump pulse. With the laser resonator cavity designed for gain switching, the output of the upconversion laser produces a short pulse similar to a Q-switched pulse. However, if the build-up time for population inversion in upconversion laser gain element 2160 is too long, there is a possibility that Q-switch 2199 will begin closing, or be completely closed, before the upconversion Q-switched pulse is generated. In this case, some of the upconversion laser output energy may be lost.

An different type of Q-switch can produce a cw emission from pump laser gain element 2101 and a Q-switched pulse from upconversion laser gain element 2160. This can be accomplished by using a mechanical chopper as an intracavity Q-switch with a unique aperture wheel. Standard chopper wheels are opaque and contain slots to provide repetitive shuttering as the wheel is rotated. For a standard chopper wheel, shuttering occurs at both the wavelength produced by pump laser gain element 2101 and the wavelength produced by upconversion laser gain element 2160. However, rather than using a chopper wheel that is opaque to both wavelengths, a clear, transmissive wheel can be used. This type of chopper wheel can be made of a material such as glass or optical plastic that is transparent to the pump and upconversion laser wavelengths.

Figure 22:
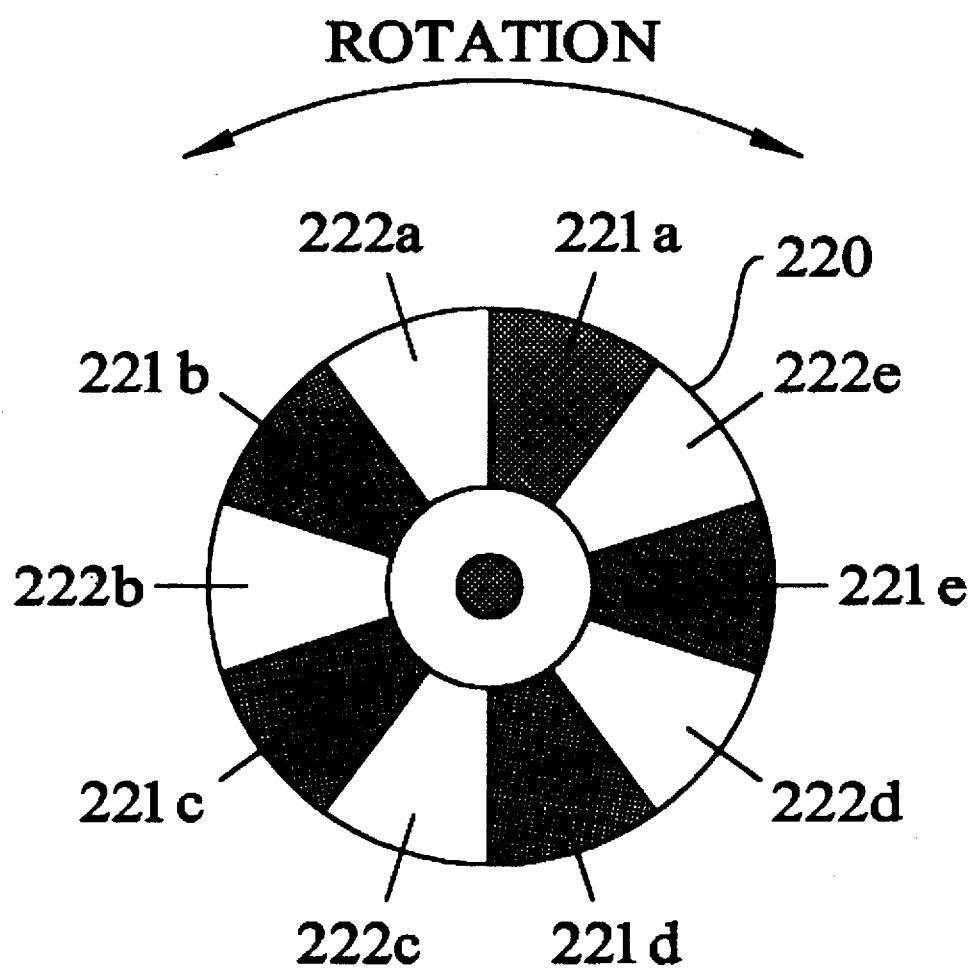
FIG. 22 illustrates a chopper wheel for Q-switching an intracavity-pumped upconversion laser.

An exemplary chopper wheel is illustrated in FIG. 22. Chopper wheel 220 is coated in specific regions to be highly reflective (or highly absorbing) at the wavelength produced by the upconversion laser gain element but transparent, that is, highly transmissive, at the wavelength produced by the pump laser gain element. The coating is applied to the wheel in a pattern that simulates a chopper blade. That is, there are alternate regions that are coated, separated by regions that are not coated. In the exemplary chopper wheel illustrated in FIG. 22, regions 221a, 221b, 221c, 221d and 221e are coated, while regions 222a, 222b, 222c, 222d and 222e are uncoated. Alternatively, regions 222a, 222b, 222c, 222d and 222e can be coated AR for both the wavelength produced by the upconversion laser gain element and the wavelength produced by the pump laser gain element.

Since both regions 221a through 221e and regions 222a through 222e are transparent to the pump wavelength, rotating such a chopper wheel inside laser resonator cavity 2107 of FIG. 21 has no effect on the operation of laser 2190 at the wavelength produced by pump laser gain element 2101. Therefore, the pump wavelength oscillates continuously in laser resonator cavity 2107. On the other hand, operation of laser 2190 of FIG. 1 at the upconversion laser output wavelength is alternatively blocked and unblocked as chopper wheel 220 of FIG. 22, located at position 2190 of FIG. 21, rotates in the direction shown in FIG. 22. Therefore, cw intracavity pumping and repetitively Q-switched upconversion laser emission can be accomplished using such a chopper wheel as illustrated in FIG. 22 in an intracavity-pumped upconversion laser such as laser 2190 illustrated in FIG. 21.

Figure 23:
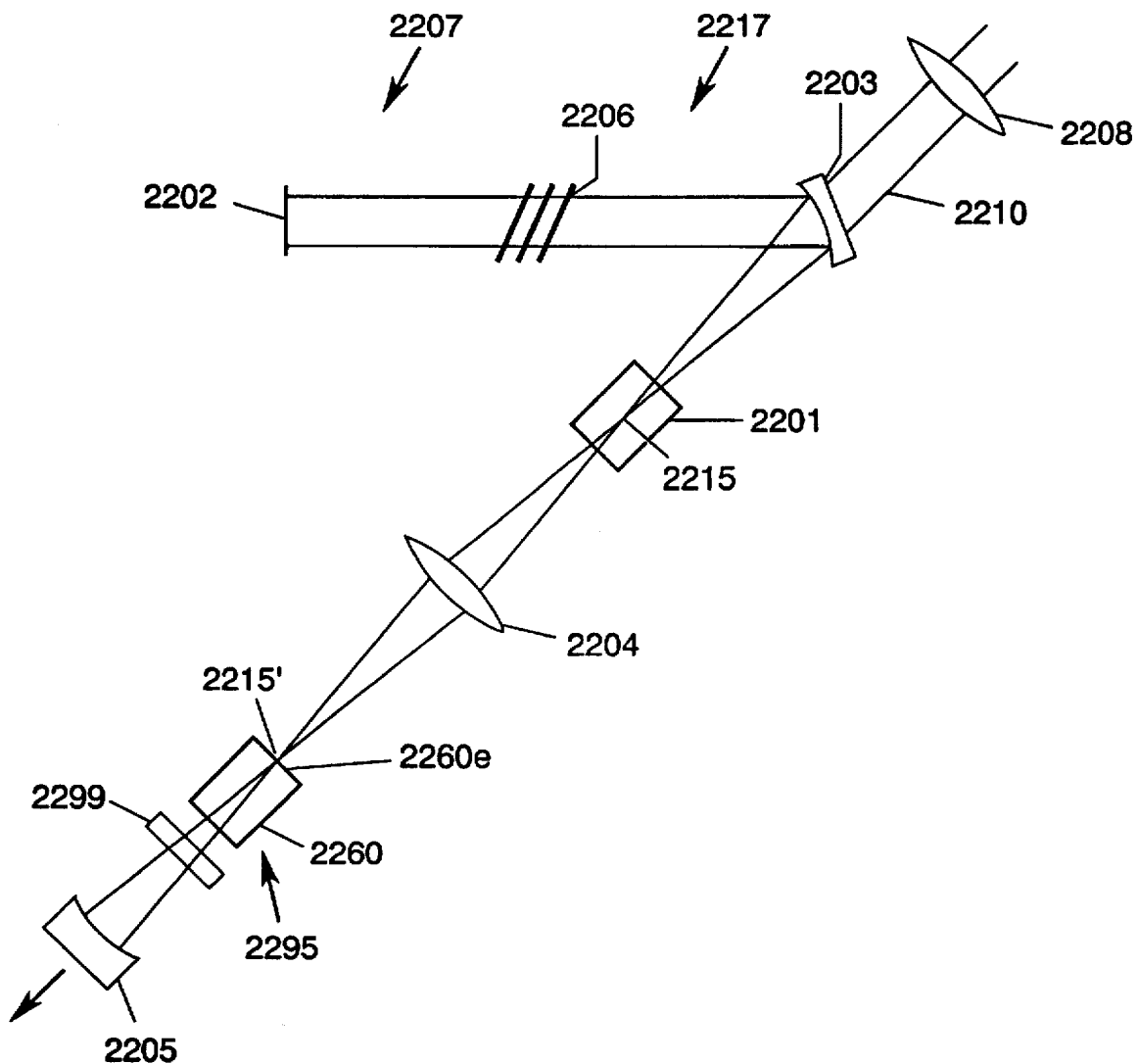
FIG. 23 illustrates a fifth embodiment of the upconversion laser of the present invention.

In FIG. 23, the concave fold mirror of FIG. 21 is replaced by lens 2204. Flat mirror 2202, concave fold mirror 2203 and concave output coupler mirror 2205 define a laser resonator for laser 2217 containing pump laser gain element 2201. Tuning element 2206 is disposed within laser resonator cavity 2207 to adjust the wavelength produced by pump laser gain element 2201 in laser 2217. A first laser resonator mode waist 2215 is produced at the center of pump laser gain element 2201, while a second laser resonator mode waist 2215' is located at exterior face 2260e of upconversion laser gain element 2260. The laser resonator 2295 for the upconversion laser wavelength extends from exterior face 2260e to concave output coupler mirror 2205.

The main advantage of the embodiment illustrated in FIG. 23 is that astigmatism produced by the off-axis use of concave fold mirror 2104 in the embodiment of FIG. 21 is eliminated by the use of lens 2204 at normal incidence. Another advantage is that the fold angle at fold mirror 2104 in FIG. 21 is eliminated. Referring to FIG. 21, upconversion laser gain element 2160 may be located in a cryostat, requiring a large fold angle at fold mirror 2104. This is due to the relatively large outer dimensions of the cryostat. In the embodiment illustrated in FIG. 23, however, the size of a cryostat or other housing used to contain upconversion laser gain element 2260 does not affect the resonator optics..

Optical pumping of pump laser gain element 2201 can be produced from a laser source, not shown. The pump light passes through focusing lens 2208 to produce focused pump beam 2210 that focuses at or near the position of first laser resonator mode waist 2215 in pump laser gain element 2201. Intracavity Q-switch apparatus 2299 is disposed to produce repetitively Q-switched operation of the upconversion emission produced by upconversion laser gain element 2260 in laser 2217.

Figure 24:
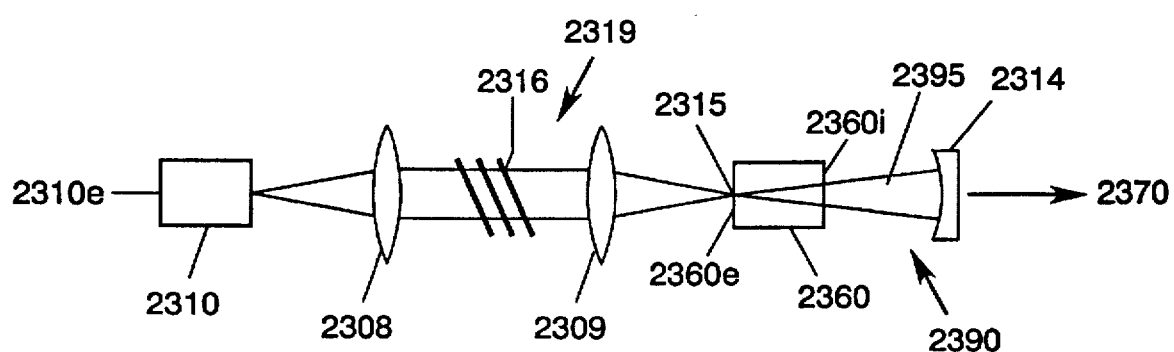
FIG. 24 illustrates a sixth embodiment of the upconversion laser of the present invention.

In FIG. 24, pump laser gain element 2310 is disposed in a laser resonator cavity defined by exterior face 2310e of semiconductor pump laser gain element 2310 and concave output coupler mirror 2314. Exterior face 2310e is coated to be highly reflective at the pump wavelength emitted by semiconductor pump laser gain element 2310.

Laser resonator cavity 2319 is bounded by exterior face 2310e and concave output coupler mirror 2314. Laser resonator cavity 2319 encloses collimating optics 2308 for collimating the diverging output from semiconductor pump laser gain element 2310, tuning element 2316 for adjusting the pump wavelength emitted by semiconductor laser gain element 2310, focusing optics 2309 for focusing the laser resonator mode to a laser resonator mode waist 2315 in laser resonator cavity 2319, and upconversion laser gain element 2360. Exterior face 2360e of upconversion laser gain element 2360 is coated HR for the upconversion laser output wavelength and HT for the pump wavelength emitted by semiconductor pump laser gain element 2310. Interior face 2360i of upconversion laser gain element 2360 is coated to be AR at both the pump wavelength emitted by semiconductor pump laser gain element 2310 and the upconversion laser wavelength emitted by upconversion laser gain element 2360.

Upconversion laser resonator 2390 extends from exterior face 2360e to concave output coupler mirror 2314. Concave output coupler mirror 2314 is coated to be highly reflective at the pump wavelength produced by pump laser gain element 2310 and partially reflective at the upconversion laser wavelength produced by upconversion laser gain element 2360. The pump wavelength is established within laser resonator cavity 2319 by suitable orientation of focusing and collimating optics 2309 and 2308, respectively, and concave output coupler mirror 2314. Tuning element 2316 is adjusted to produce the desired pump wavelength. Upconversion laser gain element 2360 is then inserted into laser resonator cavity 2319 so that exterior face 2360e is located at the position of laser resonator mode waist 2315 of the laser resonator mode of pumping emission. The orientation and position of upconversion laser gain element 2360 with respect to waist 2315 of the laser resonator mode of pumping emission and concave output coupler mirror 2314 is adjusted to produce a hemispherical laser resonator mode of upconversion emission 2395 at the upconversion laser output wavelength. Upconversion laser output is emitted in direction 2370.

Upconversion laser gain element 2360 may be contained within a cryostat (not shown) for operation at temperatures below room temperature. For optimum operation the absorption by upconversion laser gain element 2360 of pump light produced by pump laser gain element 2310 should be relatively low. Typically less than 10% single pass absorption of the pumping emission by upconversion laser gain element 2360 is acceptable, as higher absorption will extinguish laser emission in laser resonator cavity 2319.

An advantage of intracavity pumping is that intracavity power at the pump wavelength is substantially higher than the power at the laser output wavelength. For example, for a pump laser which produces 1 W of pump power using a 95% reflective output coupler, the intracavity circulating optical flux is approximately 20 W. If an upconversion laser gain element absorbs an exemplary 5% of the incident pump flux, it will absorb only 50 mW of pump power when placed in a 1 W beam located external to the pump laser cavity. On the other hand, the upconversion laser gain element will absorb 1 W of power when using intracavity pumping. This is equivalent to 100% absorption relative to placing the upconversion gain element outside the pump laser cavity.

Another advantage of intracavity pumping of the upconversion laser gain element is that the unabsorbed pump flux transmitted by the upconversion laser gain element is recirculated in the laser resonator cavity. The optical conversion efficiency for upconversion laser emission pumped by wavelengths resonant with the metastable state typically exceeds 30% when based on absorbed pump power, but is approximately 4% when based on incident pump power.

Closed cycle cryogenic chillers, which are the most convenient devices to use to produce cryogenic temperatures in upconversion laser crystals, add weight and reduce the overall electrical efficiency of upconversion lasers. A more practical approach is to operate the upconversion laser at room temperature, but as illustrated in FIGS. 8 and 18, the laser output power decreases rapidly as the temperature increases above cryogenic temperatures. This decrease in output power with temperature is observed for numerous crystalline upconversion lasers. Fiber upconversion lasers, on the other hand, operate efficiently at room temperature due to the waveguiding nature of the fiber environment. However, upconversion fiber lasers are not as efficient as upconversion crystalline lasers.

Figure 25:
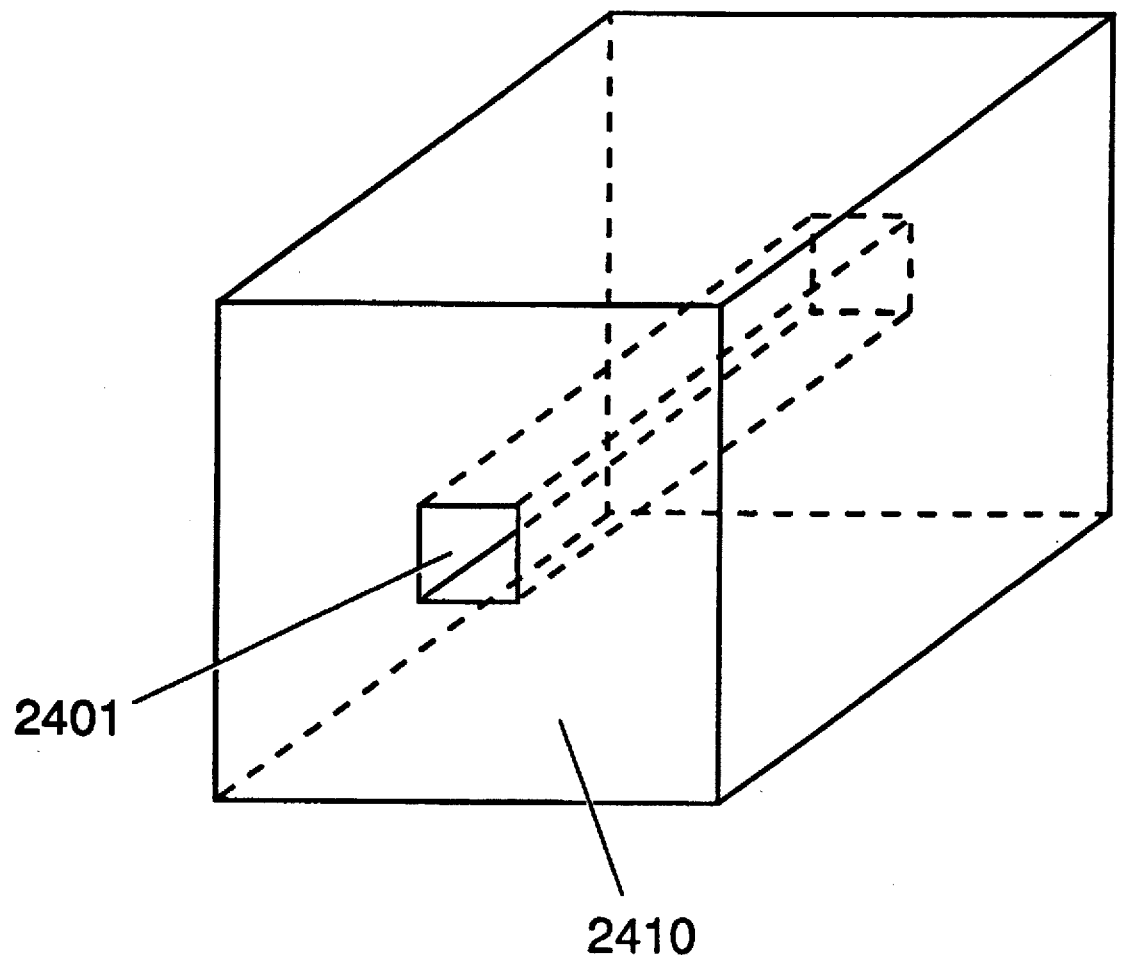
FIG. 25 illustrates a seventh embodiment of the upconversion laser of the present invention.

An ideal upconversion laser gain element would have the architecture of a waveguide but the structure of a single crystal. Such a device is illustrated in FIG. 25. An upconversion laser gain element 2401 is surrounded by cladding layer 2410. Upconversion laser gain element 2401 and cladding layer 2410 may have flat surfaces to assure molecular bonding between them. Gain element 2401 may comprise, for example, a crystalline oxide host doped with activator ions and have the shape of a rectangular solid with a square cross-section, although other materials and shapes for upconversion laser gain element 2401 may be used. Cladding layer 2410 is composed of a material that is molecularly bonded to upconversion laser crystal 2401, although other bonding techniques are compatible with this inventive concept. The cladding material that composes cladding layer 2410 preferably has a lower index of refraction than the material used for gain element 2401 to form a waveguide for the radiation propagating in gain element 2401. Both pump light and upconversion laser emission may thus be confined within upconversion laser crystal 2401 to maintain extremely high pump intensities over relatively long upconversion laser gain element lengths. The high pump power density may produce a bleaching effect in which the ground state absorbers are effectively depleted by the pump flux. This effect may be used to produce continuous upconversion laser emission at room temperature.

Cladding layer 2410 may be bonded to upconversion laser gain element 2401 by a well-known molecular bonding process in which forces such as van der Waals forces produce a flat, sharp interface between two materials with different refractive indices. The cross sectional dimensions of upconversion laser crystal 2401 are typically on the order of the dimensions of the pump waist, that is, 50 μm or less. Laser crystals of these dimensions may be manufactured routinely. Coatings of the type described above for upconversion laser gain elements on the end faces of upconversion laser crystal 2401 may also be applied. One of the end faces can be coated HT at the pump wavelength and HR at the emitted wavelength and the other end face could be HR at the pump wavelength and partially reflective (PR) at the emitted wavelength to form a laser resonator.

Upconversion laser crystal 2401 in conjunction with cladding layer 2410 forms a crystalline waveguide upconversion laser gain element. Suitable materials for the crystalline host material in gain element 2401 include yttrium orthoaluminate, YAG and various crystalline fluorides such as YLF. Suitable activator ions include trivalent erbium ions, trivalent praseodymium ions, trivalent neodymium ions, trivalent holmium ions, trivalent thulium ions or other rare earth ions.

Many modifications and variations of the present invention are possible within the scope of the following claims to practice the invention otherwise than described above.

I claim:

1. An apparatus comprising:
   an upconversion laser gain element made of a crystalline oxide host doped with activator ions for emitting output radiation in response to pumping radiation, wherein said output radiation has an output wavelength that is shorter than a pumping wavelength of said pumping radiation; and
   a laser resonator comprising a reflective element and an output coupler operably coupled to said gain element for forming an output radiation waist that is substantially coincident with a pumping radiation waist within an active region of said gain element, wherein said reflective element is spaced from said output coupler by a distance approaching the radius of curvature of at least one of said reflective element and said output coupler.

2. The apparatus of claim 1, wherein said gain element has an exterior face that is highly reflective to radiation at said output wavelength and highly transmissive to radiation at said pumping wavelength, and has an interior face that is antireflective to radiation at said pumping wavelength.

3. The apparatus of claim 2, further comprising an adjustable enclosure for aligning said output coupler with said exterior face and for maintaining said gain element in a vacuum environment.

4. The apparatus of claim 3, wherein said adjustable enclosure is a flexible bellows.

5. The apparatus of claim 2, further comprising a focuser for focusing said pumping radiation on said exterior face.

6. The apparatus of claim 1, wherein the concentration of activator ions in said crystalline oxide host, the wavelength, power, and bandwidth of said pumping radiation, and the temperature of said gain element are selected to effect a maximum power of said output radiation, wherein said maximum power obtained by pumping with pump wavelengths in the 800 nm band of Er:YALO are approximately 8 mW for sequential two-photon absorption, 166 mW for pumping by cooperative energy transfer upconversion, and 33 mW for pumping by photon avalanche.

7. The apparatus of claim 1, further comprising a pumping source operably coupled to said gain element for providing said pumping radiation.

8. The apparatus of claim 7, wherein said pumping source comprises a semiconductor laser diode.

9. The apparatus of claim 7, wherein said pumping source comprises a laser.

10. The apparatus of claim 9, wherein said laser comprises a Ti:sapphire laser.

11. The apparatus of claim 1, further comprising a cooler operably coupled for cooling said gain element.

12. The apparatus of claim 11, wherein said cooler comprises a cryostat.

13. The apparatus of claim 11, wherein said cooler has a first surface for passing said pumping radiation oriented at Brewster's angle with respect to a direction of propagation of said pumping radiation and has a second surface window for passing said output radiation oriented at Brewster's angle with respect to said direction of propagation of said output radiation.

14. The apparatus of claim 1, wherein said crystalline host comprises at least one of yttrium orthoaluminate and yttrium aluminum garnet, and wherein said activator ions comprise at least one of trivalent ions of erbium, neodymium, holmium, praseodymium, and thulium.

15. The apparatus of claim 14, wherein said Q-switch comprises at least one of an acousto-optic shutter, an electro-optic shutter, and a mechanical shutter.

16. The apparatus of claim 1, further comprising a Q-switch operably coupled to said laser gain element for Q-switching said output radiation.

17. The apparatus of claim 1, wherein said laser gain element is pumped in an end pumping mode.

18. The apparatus of claim 1, wherein said pumping radiation is mode matched to said output radiation in said active region of said gain element.

19. The apparatus of claim 1, wherein said output wavelength is between 300 nm and 700 nm.

20. The apparatus of claim 1 wherein said pumping wavelength is substantially 791.3 nm.

21. A laser gain element comprising:
   a crystalline host doped with activator ions for emitting upconversion output radiation; and
   a cladding operably coupled to said crystalline host to form a waveguide for confining radiation propagating within said laser gain element, wherein said crystalline host has a greater refractive index than said cladding.

22. An apparatus comprising:
   an Er:YALO laser gain element;
   a laser resonator operably coupled to said gain element for emitting output radiation at an output wavelength; and
   a pumping source operably to said for pumping said gain element with pump radiation having a pumping wavelength to cause said gain element to emit said output radiation by at least one of:, cooperative energy transfer upconversion, avalanche upconversion in said gain element, and sequential two-photon absorption.

23. The apparatus of claim 22, wherein said pump radiation is mode matched to said output radiation.

24. The apparatus of claim 23, wherein said pumping source is operably coupled for end pumping said gain element.

25. The apparatus of claim 22, wherein said pumping wavelength is between 750 nm and 1000 nm.

26. The apparatus of claim 22, wherein said pumping source comprises a Ti:sapphire laser.

27. The apparatus of claim 26, wherein said Ti:sapphire laser is pumped by at least one of an argon ion laser, a doubled trivalent neodymium ion-doped solid state laser, and a copper vapor laser.

28. The apparatus of claim 22, wherein said pumping source comprises a laser diode.

29. The apparatus of claim 28, wherein said laser diode comprises a single mode laser diode.

30. The apparatus of claim 22, further comprising a cooler for cooling said gain element.

31. The apparatus of claim 22, further comprising a Q-switch operably coupled to said gain element for Q-switching said output radiation.

32. The apparatus of claim 22, wherein said pumping source is operably coupled for side pumping said gain element.

33. The apparatus of claim 22 wherein said pumping wavelength is substantially 791.3 nm.

34. An apparatus comprising an upconversion laser gain element comprising a host material doped with activator ions, wherein said activator ions are excited from a metastable state to an excited state at a higher energy level than that of said metastable state for producing upconversion laser emission in response to a pumping radiation.

35. The apparatus of claim 34, wherein said crystalline host comprises at least one of yttrium orthoaluminate and yttrium aluminum garnet, and wherein said activator ions comprise at least one of trivalent erbium, neodymium, holmium, praseodymium, and thulium.

36. The apparatus of claim 34, further comprising a pumping source operably coupled to said gain element.

37. The apparatus of claim 36, wherein said pumping source is operably coupled for end pumping said gain element.

38. The apparatus of claim 36, wherein said pumping source is operably coupled for side pumping said gain element.

39. The apparatus of claim 34, further comprising a Q-switch for Q-switching said laser emission.

40. The apparatus of claim 34, wherein said gain element comprises a cladding operably coupled to said crystalline host for confining radiation propagating within said gain element, wherein said crystalline host has a greater refractive index than said cladding.

41. The apparatus of claim 34 wherein said pumping radiation has a wavelength of substantially 791.3 nm.

42. An apparatus comprising:

an upconversion laser gain element for upconversion laser emission:

a first laser resonator operably coupled to said upconversion laser gain element;

a pump gain element; and a second laser resonator operably coupled to said pump gain element and to said first laser resonator for intracavity pumping of said upconversion laser gain element by pumping radiation produced by said pump gain element.

43. The apparatus of claim 42, wherein said pump laser gain element emits said pumping radiation at a plurality of wavelengths.

44. The apparatus of claim 42, wherein said pump laser gain element is tunable to emit said pumping radiation within a range of wavelengths.

45. The apparatus of claim 42, wherein said upconversion laser gain element has an interior face that is antireflective at said pumping wavelength and said upconversion wavelength.

46. The apparatus of claim 42, wherein said pump laser gain element comprises at least one of Ti:sapphire and a semiconductor laser diode.

47. The apparatus of claim 42, further comprising a Q-switch operably coupled to said upconversion gain element for Q-switching said upconversion radiation. refractive index of said cladding.

48. The apparatus of claim 47, wherein said Q-switch comprises at least one of an acousto-optic, an electro-optic, and a mechanical shutter.

49. The apparatus of claim 42, wherein said upconversion laser gain element comprises a crystalline host and a cladding operably coupled to said crystalline host for confining radiation propagating within said gain element, wherein said crystalline host has a greater refractive index than said cladding.

50. The apparatus of claim 42 in which said upconversion laser gain element comprises crystalline yttrium orthoaluminate doped with at least one of trivalent ions of erbium, thulium, praseodymium, neodymium, and holmium.

51. The apparatus of claim 42, further comprising a tuning element disposed in said resonator for tuning the wavelength of said output radiation.

52. The apparatus of claim 42, wherein said gain element has an exterior face that is highly reflective to radiation at said output wavelength and highly transmissive to radiation at said pumping wavelength, wherein reflections of said pumping radiation by said exterior face are mode matched to said pumping radiation.

53. The apparatus of claim 42 wherein said pumping radiation has a wavelength of substantially 791.3 nm.

54. A laser comprising:

a laser gain element made of a crystalline host doped with activator ions responsive to a pumping radiation for emitting output radiation having a shorter wavelength than said pumping radiation;

a laser resonator comprising a reflective element and an output coupler operably coupled to said gain element for forming an output radiation waist that is substantially coincident with a pumping radiation waist within an active region of said gain element, wherein said reflective element is spaced from said output coupler by a distance approaching the radius of curvature of at least one of said reflective element and said output coupler;

a cladding operably coupled to said crystalline host for confining radiation propagating within said gain element, wherein said crystalline host has a greater refractive index than said cladding; and a pumping source operably coupled to said gain element for pumping said gain element with pump radiation at a pumping wavelength, wherein said pumping source produces at least one of sequential two photon absorption, cooperative energy transfer upconversion, and photon avalanche upconversion in said gain element.

55. The apparatus of claim 54 wherein said pumping wavelength is substantially 791.3 nm.

* * * * *